United States Patent
Aubert

(10) Patent No.: US 10,568,171 B2
(45) Date of Patent: Feb. 18, 2020

(54) UNIVERSAL AC AND DC INPUT MODULAR INTERCONNECTABLE PRINTED CIRCUIT BOARD FOR POWER DISTRIBUTION MANAGEMENT TO LIGHT EMITTING DIODES

(71) Applicant: 2449049 Ontario Inc., Mississauga (CA)

(72) Inventor: Andrew Clark Baird Aubert, Waterdown (CA)

(73) Assignee: 2449049 Ontario Inc., Mississauga, Ontario (CA)

( * ) Notice: Subject to any disclaimer, the term of this patent is extended or adjusted under 35 U.S.C. 154(b) by 0 days.

(21) Appl. No.: 16/126,307

(22) Filed: Sep. 10, 2018

(65) Prior Publication Data

US 2019/0098714 A1    Mar. 28, 2019

Related U.S. Application Data

(60) Provisional application No. 62/556,694, filed on Sep. 11, 2017.

(51) Int. Cl.
*H05B 33/08* (2006.01)
*H05K 1/18* (2006.01)
(Continued)

(52) U.S. Cl.
CPC ........... *H05B 33/0842* (2013.01); *B60Q 3/41* (2017.02); *B61D 29/00* (2013.01);
(Continued)

(58) Field of Classification Search
CPC ............ H05B 33/0815; H05B 33/0842; H05B 33/0845; H05B 33/0896
(Continued)

(56) References Cited

U.S. PATENT DOCUMENTS 4,740,883 A    4/1988 McCollum
5,751,118 A    5/1998 Mortimer
(Continued)

FOREIGN PATENT DOCUMENTS

WO    WO 2013012046 A1    1/2013

OTHER PUBLICATIONS

International Search Report for corresponding PCT Application No. PCT/CA2018/051112 dated Dec. 20, 2018.
English Abstract of WO 2013012046.

*Primary Examiner* — Tung X Le
(74) *Attorney, Agent, or Firm* — Caesar Rivise, PC

(57) ABSTRACT

A continuous power distribution circuit board containing:
i) A printed circuit board;
ii) A universal power node;
iii) At least one channel on the printed circuit board for passage of current, signal and combinations thereof throughout the board;
iv) At least one bridge rectifier in communication with the universal power node for rectifying non-discrete input current to discrete output current;
v) At least one capacitor in communication with the at least one bridge rectifier minimizing voltage potential fluctuation from the bridge rectifier;
vi) At least one current load in communication with the at least one capacitor;
wherein the continuous power distribution circuit board maintains a constant current to the at least one current load without any external current controller.

17 Claims, 18 Drawing Sheets

(51) Int. Cl.
  *H05K 1/02* (2006.01)
  *B60Q 3/41* (2017.01)
  *B61D 29/00* (2006.01)

(52) U.S. Cl.
  CPC ..... *H05B 33/0815* (2013.01); *H05B 33/0896* (2013.01); *H05K 1/0216* (2013.01); *H05K 1/181* (2013.01); *H05K 2201/1006* (2013.01); *H05K 2201/10015* (2013.01); *H05K 2201/10022* (2013.01); *H05K 2201/10106* (2013.01); *H05K 2201/10166* (2013.01)

(58) Field of Classification Search
  USPC ...................................... 315/185 R, 192, 193
  See application file for complete search history.

(56) References Cited

U.S. PATENT DOCUMENTS

| | | | |
|---|---|---|---|
| 7,701,083 B2 | 4/2010 | Savage | |
| 8,342,884 B2 | 1/2013 | Bishop et al. | |
| 8,384,299 B1 | 2/2013 | Burdalski et al. | |
| 8,668,352 B2 | 3/2014 | Park et al. | |
| 8,954,170 B2 | 2/2015 | Chemel et al. | |
| 9,392,669 B2 | 7/2016 | Recker et al. | |
| 9,446,710 B2 | 9/2016 | Ambroz et al. | |
| 9,593,835 B2 | 3/2017 | Grave et al. | |
| 9,612,602 B2 | 4/2017 | Smith et al. | |
| 9,671,075 B2* | 6/2017 | Greene | H05B 33/0803 |
| 2010/0019689 A1* | 1/2010 | Shan | G09F 9/33 315/294 |
| 2011/0221346 A1 | 9/2011 | Lee et al. | |
| 2012/0002417 A1* | 1/2012 | Li | F21V 17/007 362/249.02 |
| 2012/0086345 A1* | 4/2012 | Tran | H05B 33/0845 315/158 |
| 2013/0147269 A1 | 6/2013 | Zimmermann et al. | |
| 2014/0293595 A1* | 10/2014 | May | F21V 3/0625 362/218 |
| 2015/0223303 A1 | 8/2015 | Hsia et al. | |
| 2017/0367158 A1* | 12/2017 | Petersen | H05B 33/0827 |

\* cited by examiner

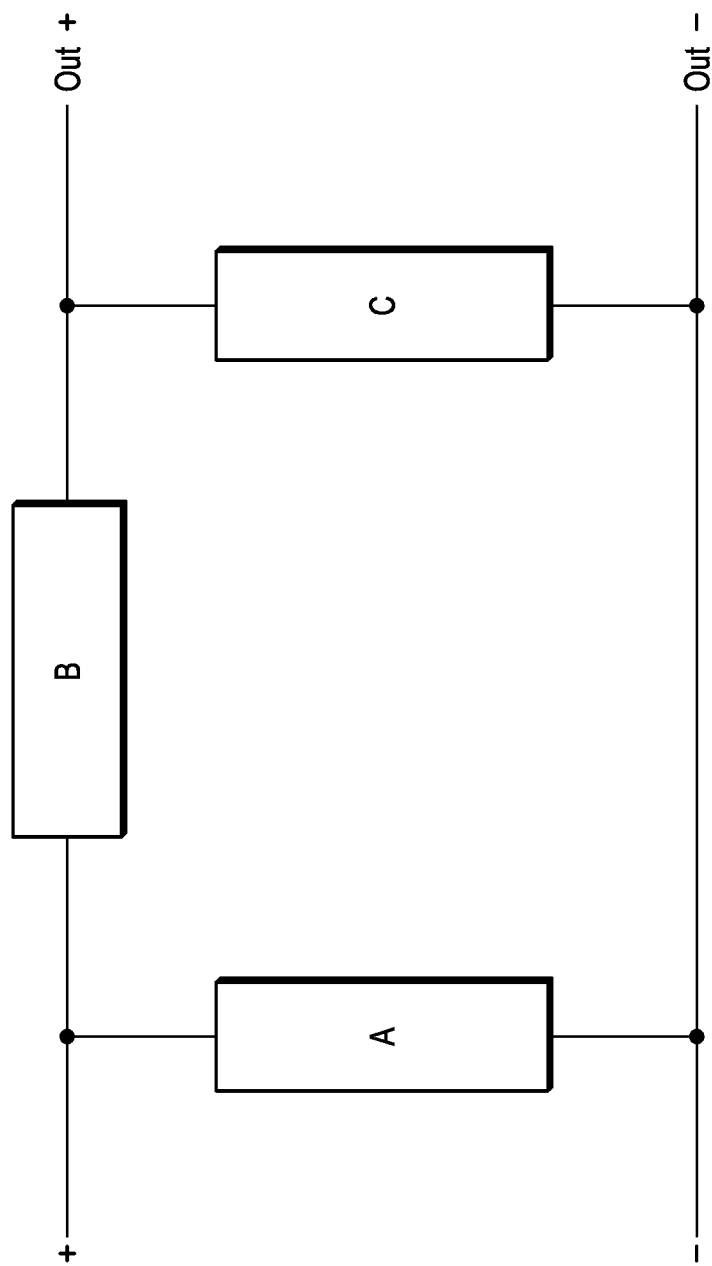

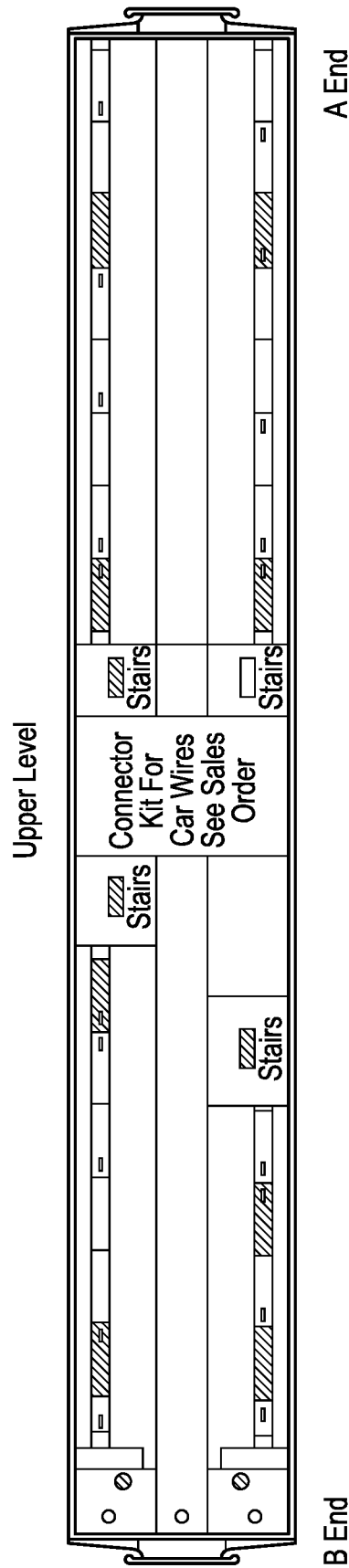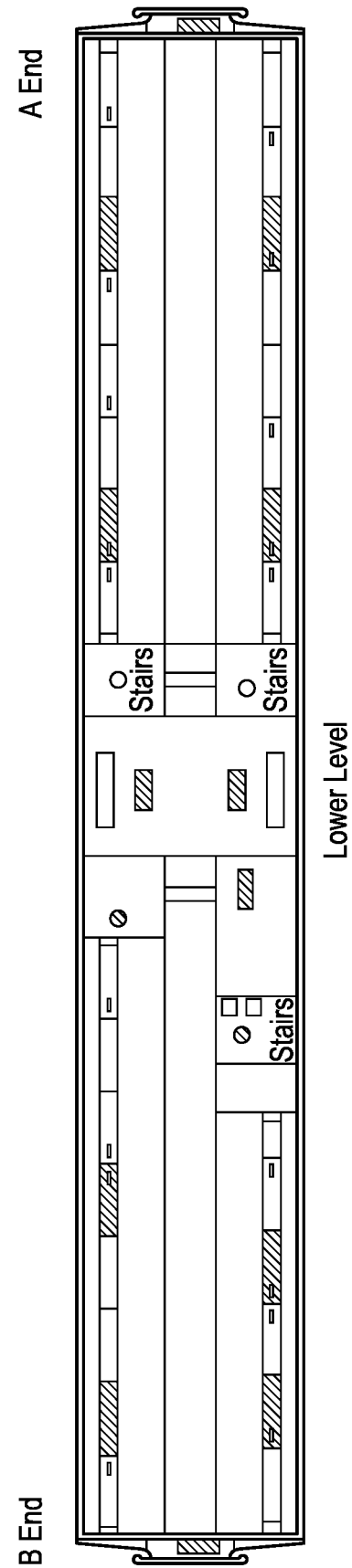
FIG. 9A-1
FIG. 9A-2

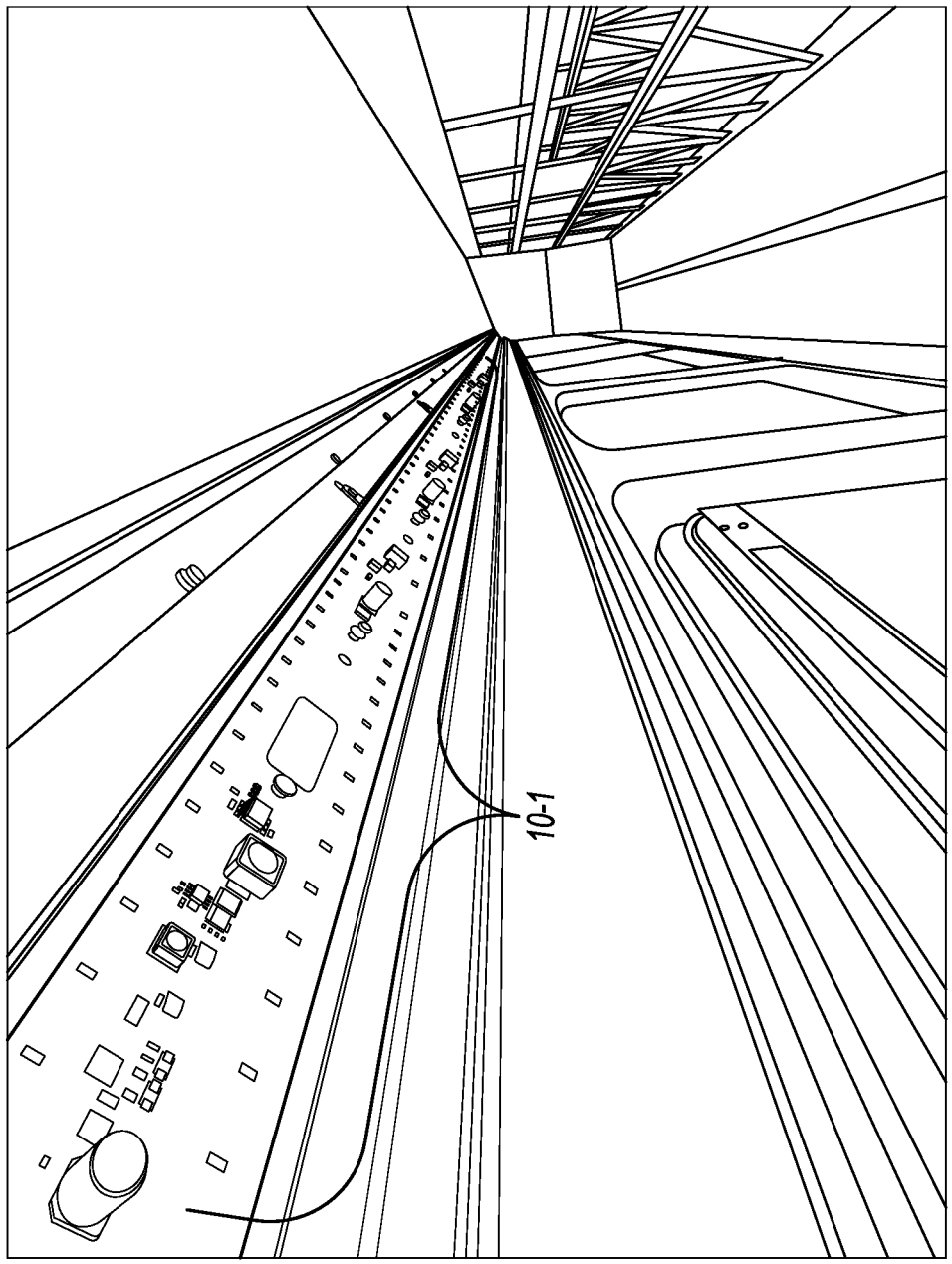

UNIVERSAL AC AND DC INPUT MODULAR INTERCONNECTABLE PRINTED CIRCUIT BOARD FOR POWER DISTRIBUTION MANAGEMENT TO LIGHT EMITTING DIODES

FIELD OF THE DISCLOSURE

The embodiments described herein relate generally to transit power management and distribution boards, in particular for Light Emitting Diode (LED) lighting, and particularly to power management and distribution in an LED lighting system using Printed Circuit Boards (PCB).

BACKGROUND

LED lighting systems are the lighting design of choice in many modern settings, notably in train and airplane cabins, due to high efficiency, low power consumption, long endurance and other advantages of LEDs. There are challenges in design and implementation of such electrical systems especially in environments where space is tight and access is limited or power needs to be transmitted to the LED's are over long distances. More specific to this disclosure, multiple voltage ranges may be used as the power input to the system that is normally handled by additional hardware.

At the Integrated Circuit (IC) level, LEDs are current driven devices where the light intensity is highly correlated with the current that is supplied to an LED.

LEDs have a very quick response time (~20 nanoseconds) and instantaneously reach full light output. Rectifying the AC to DC conversion causes ripples in the voltage and current output from the driver to the LED. This ripple typically occurs at twice the frequency of the incoming line voltage. The LED output then correlates with the output waveform of the driver. Hence, there is needed a means to filter out these frequency noises and ripples which may cause undesirable intensity changes or flickers in the LED.

The relationship between the LED forward current and Relative Luminous Intensity of the LED STW8Q14D-EMC is relatively linear and close to 1:1. Thus constant light intensity may be achieved by maintaining constant forward current through the LED. Therefore, it is important to maintain a constant driving current. At present, several constant current IC designs exist, however the existing ICs that can function when more than 100V DC is applied have a topology that makes their output current dependent upon the input voltage. Consequently, variation in the input voltage would result in variations in output current and hence intensity fluctuations in the LED lights. For example, a typical IC data sheet reads (DIODES® Incorporated Data Sheet AL9910_A):

$$L = \frac{(V_{IN} - V_{LED}) \times D}{(0.3 \times I_{LED}) \times f_{OSC}} \text{ and} \qquad \text{Eq. 1}$$

$$t_{OSC} = \frac{R_{OSC} + 22}{25} \mu s \qquad \text{Eq. 2}$$

wherein L=Inductance, VIN=Input Voltage, VLED=Total voltage drop across the LED string, ILED=LED drive current, fosc=Switching frequency, Tosc=Oscillator period, Rosc=Switching frequency set resistor (in KΩ). See for example IC AL9910_1 data sheet link: www.diodes.com/assets/Datasheets/AL9910_A.pdf; LED STW8Q14D-EMC data sheet link: www.seoulsemicon.com/upload2/Specification_5630D_STW8Q14D_E3_Rev0.1_171220.pdf; Transistor DXT13003DG-13 from Diodes Incorporated data sheet www.diodes.com/assets/Datasheets/DXT13003DG.pdf; MOSFETS TN3N40K3 from STMicroelectronics data sheet link: www.st.com/content/ccc/resource/technical/document/datasheet/e1/9f/5b/ab/3e/c6/4b/21/CD00278221.pdf/files/CD00278221.pdf/jcr:content/translations/en.CD00278221.pdf. Based on Eq. 1, for instance a minimum variance of 26% in intensity fluctuation may result in from a range of 24V DC to 120V AC of the input power. To address this problem, the primary power needs to be pre-conditioned to accept the wide range of voltages. Additional power conditioning may electrically be inefficient.

Currently, multiple fixture types (e.g. one for 120V AC input and another for 24V DC input) are used to accommodate the multiple voltages received from multiple entry points. This solution requires more wiring, additional cavity of space to pass wires, and additional cost of parts and installations. These solutions are labor intensive and expensive. Maintenance and replacement of parts, inventory management, and schematic layouts are more complex with multiple fixtures. There exist designs that address a continuous power distribution from either an AC or a DC power supply but not from a single entry point for power. Some prior art use a linear topology for driving the LEDs via resistive/passive/linear methods. Over wide voltage ranges these methods are not power efficient. As an example, for the aforementioned voltage range of 24 VDC-120 VDC, the maximum efficiency of the driver at 120 VDC would be 20% for such systems. For main lighting in a rail environment, typically 6 W of LED power per foot is required to meet current lighting level specifications. In such a design with 20% efficiency, the LED lights could consume up to 30 W per foot that would result in consumption of 2400 W power over an 80 foot train.

Therefore, it would be advantageous to have a single fixture that allows a universal single electric power entry point for both AC and DC power and to provide a means to distribute power and signals to current loads, such as LED lighting systems, efficiently and reliably, along a long distance, and in particular, for distances greater than about 9m, and preferably greater than about 25m.

SUMMARY

According to one aspect, there is provided a continuous power distribution circuit board comprising:
i) A printed circuit board having a top, a bottom, a first end and a second end and a power supply; preferably said power supply is a power supply with a switch mode topology; more preferably a switch mode topology selected from the group consisting of buck, boost, buck-boost, sepic, flyback, step-up, step-down, switched capacitor and combinations thereof;
ii) a universal single entry point power node proximate one of said first end or said second end for receiving and transmitting alternating current or direct current to said board;
iii) at least one channel on said printed circuit board for passage of current, signal and combinations thereof throughout said board and from said first end to said second end;
iv) at least one bridge rectifier, in communication with said universal single entry point power node via said at least one channel, for rectifying non-discrete input current to discrete output current;

v) at least one capacitor in communication with said at least one bridge rectifier via said at least one channel, minimizing voltage potential fluctuation from said bridge rectifier;

vi) at least one current load in communication with said at least one capacitor via said at least one channel;

wherein said continuous power distribution circuit board comprises at least two current paths, one of said two paths being positive and the other of said paths being negative (or return), and said board maintains a constant current to said at least one current load regardless of input voltage range to said circuit board without any external current controller.

In one alternative, said printed circuit board further comprises at least one filter between said at least one capacitor and said at least one current load and said at least one filter in communication with said at least one capacitor and said at least one current load via said at least one channel with, said at least one filter reducing at least one of the following:

i) conducted noise;
ii) radiated noise;
iii) inrush current;
iv) voltage transients;
v) further voltage potential fluctuation; and combinations thereof.

In another alternative, said printed circuit board further comprises at least one input voltage compensation circuit in communication with said at least one current load via said at least one channel, said input voltage compensation circuit providing a constant current to said current load regardless of input voltage to said circuit board.

In yet another alternative, said at least one input voltage compensation circuit comprises at least one resistive element in communication with at least one of a base or an emitter of at least one NPN transistor, and optionally at least another resistive element in communication between a collector of said at least one NPN transistor and said at least one current load.

In yet another alternative, said at least one input voltage compensation circuit comprises at least one resistive element in communication with at least one of a gate or a drain of at least one N-channel MOSFET, and at least another resistive element in communication between a source of said at least one N-channel MOSFET and said at least one current load.

In yet another alternative, said at least one input voltage compensation circuit is in communication with said at least one current load via at least one pin of said at least one current load.

In yet another alternative, said at least one pin is selected from the group consisting of a current sense pin, frequency setting pin, linear dimming pin, pulse width modulation pin, and combinations thereof of said at least one current load.

In yet another alternative, said at least one current load is at least one current regulating driver, in one alternative, at least one light emitting diode driver, and at least one light emitting diode, in one alternative said at least one light emitting diode is an organic light emitting diode, for use in transit lighting.

In yet another alternative, said continuous power distribution circuit board maintains consistent light intensity, in one alternative no more than about 10% variance in light intensity, of said at least one light emitting diode or said at least one organic light emitting diode. In one alternative, constant light intensity is achieved by maintaining constant forward (driving) current through the light emitting diode.

In yet another alternative, said board distributes at least one of power, a signal, and combinations thereof to a distance of at least 25 metres.

In yet another alternative, said second end of said circuit board comprises a first end connector for connecting to a first end of another circuit board, for transmitting current from said first board to said second board. In one alternative said first end connector is integral with the circuit board. In another alternative, said first end connector is external to the circuit board.

In yet another alternative, said first end comprises a second end connector for connecting to a second end of another circuit board. In one alternative said second end connector is integral with the circuit board. In another alternative, said second end connector is external to the circuit board.

In yet another alternative, there is provided the use of the circuit board described herein in a transit vehicle. In an alternative, said transit vehicle is a train. In yet another alternative, said circuit board is for use in lighting of a transit vehicle, preferably a train. In yet another alternative, said circuit board is for use in transmitting signal in a transit vehicle, preferably a train.

BRIEF DESCRIPTION OF THE FIGURES

For a better understanding of the embodiments and/or related implementations described herein and to show more clearly how they may be carried into effect, reference will now be made, by way of example only, to the accompanying drawings which show at least one exemplary embodiment and/or related implementation in which:

FIG. 1B is a schematic diagram of a few exemplary optional filter designs for filtering conducted and radiated emissions and voltage fluctuations.

FIGS. 9A-1 and 9A-2 depicts a bi-level train layout incorporating the circuitry according to one alternative FIGS. 9B-1 and 9B-2 depicts the circuitry path of FIG. 9A.

FIG. 10 depicts a transit vehicle interior with a transit light and the PCB related thereto.

Figure 1:
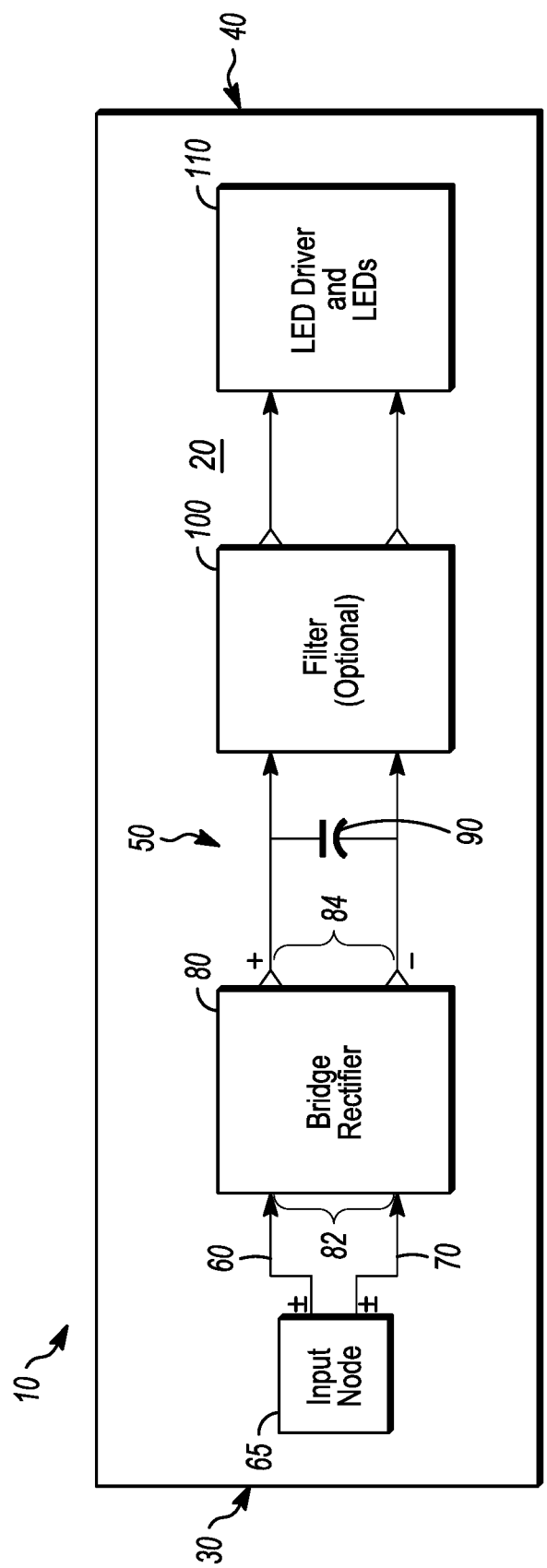
FIG. 1 is a block diagram of an embodied continuous power transmission management system with wide range of input power on a PCB, without LED intensity control.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

It will be appreciated that numerous specific details are set forth in order to provide a thorough understanding of the exemplary embodiments described herein.

However, it will be understood by those of ordinary skill in the art that the embodiments and/or implementations described herein may be practiced without these specific details. In other instances, well-known methods, procedures and components have not been described in detail so as not to obscure the embodiments and/or implementations described herein. Furthermore, this description is not to be considered as limiting the scope of the embodiments described herein, but rather to describe the structure and operation of the various embodiments and/or implementations described herein.

Referring now to FIG. 1, there is depicted a block diagram of a continuous power transmission management system 10, on a Printed Circuit Board (PCB) 20, having a first end 30, a second end 40 and a top 50, and a bottom (not shown). Proximate the first end 30, there is a single entry input node 65 to take AC or DC inputs 60 and 70. Connected to inputs 60 and 70 is a bridge rectifier 80 having an entry 82 and an exit 84. From said exit 84, there is a capacitor 90, in one alternative a bulky capacitor, and connected to the capacitor 90 is the optional filter 100 which is in communication with current load 110 that in this alternative, comprises LED drivers and one or more of the corresponding LEDs. Copper traces are routed in the PCB 20 to channel passage of power, current, and signals, individually or in combination throughout the board and from the first end to the second end along the longitudinal axis of the board. In one embodiment, varying signals are physically placed on the top 50 and the bottom (not shown) of the PCB 20 in order to minimize noise through signals for signal passing by taking advantage of the natural di-electrical layers of the PCB 20 to create a capacitance between the traces.

In a preferred embodiment, the topology of the driver is a switch mode buck. More specifically within the family of switch mode buck regulators, the current control method can be either fixed-frequency, peak-current control or open-loop current mode control. It is worth noting that, in one alternative, all embodiments meet at least the EN 50121-3-2 and all requirements and standards listed within.

Figure 1A:
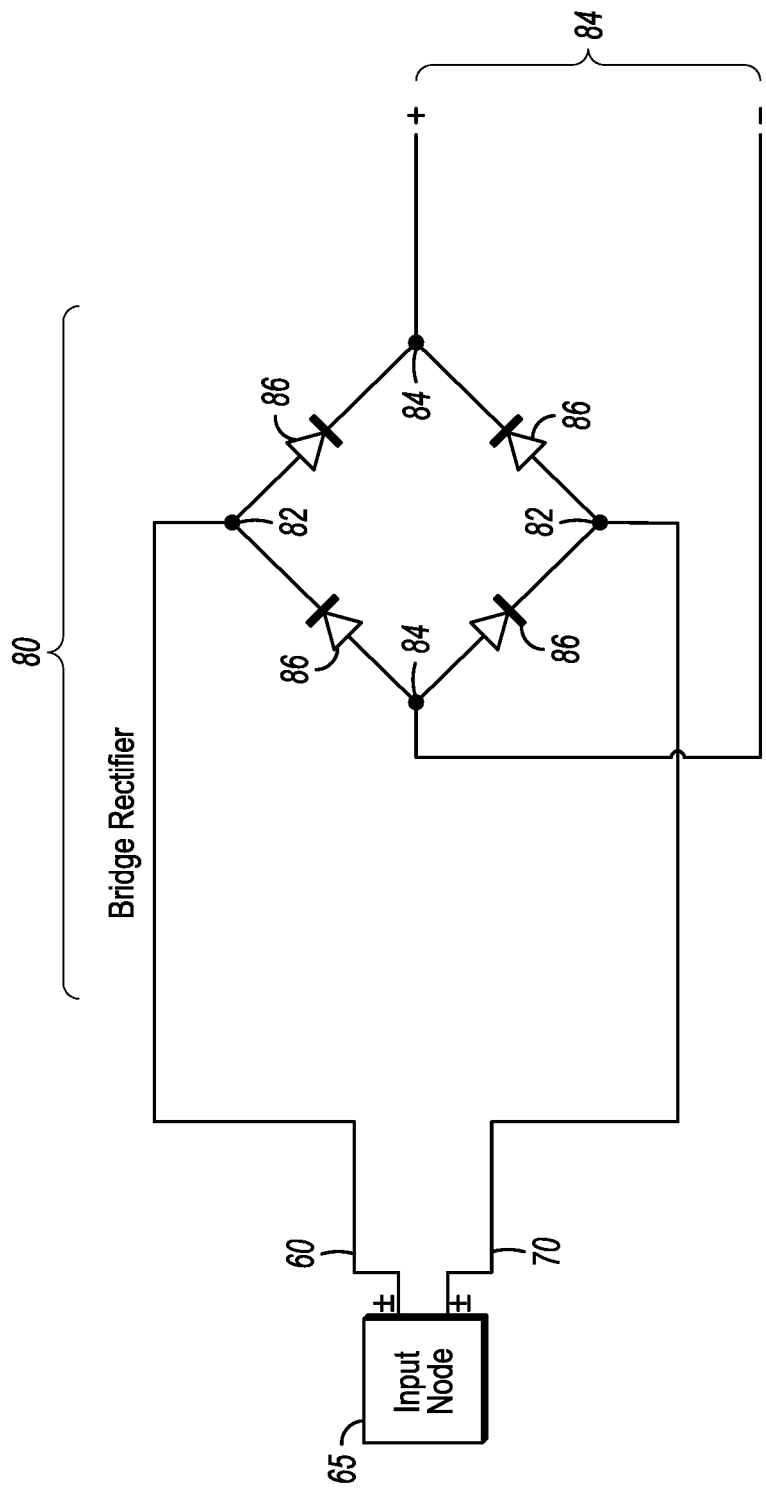
FIG. 1A is a schematic diagram of an exemplary bridge rectifier circuit.

In one embodiment, the bridge rectifier 80 comprises four diodes 86 connected to create four nodes (See FIG. 1A). Two nodes 82' are each made up of an anode and a cathode of discrete diodes, respectively. These nodes 82 each represent voltage input to the bridge rectifier. A third node 84 is made up of two cathodes representing a positive output from the bridge rectifier. A fourth node 84 is made up of two anodes representing the negative output (return) from the bridge rectifier.

The bridge rectifier 80 performs the rectification of variable power input (i.e. AC or DC) to DC output and proper designation of output polarity. This is to ensure the components of the circuit function as desired. In one alternative, the voltage rating of the diodes exceeds the maximum required operating voltage range of the input voltage; and the current rating of the diodes exceeds the maximum required operating current range. In one alternative the diodes have a voltage rating of 1 kV (exceeding the maximum limit of voltage range of 450 volts), and a current rating of 1.5 amps (exceeding the maximum limit of current range of 0.25 amps). Other voltage and current ratings will be specific to the desired application.

Referring back to FIG. 1, the capacitor 90 comprises enough capacitance to achieve a desired "ripple" or voltage potential fluctuation to ensure a consistent voltage resulting in consistent performance of the current load 110. In one exemplary embodiment, the capacitor 90 has a capacity of 33 micro Farads and a minimum voltage rating exceeding the maximum input voltage of the system. Also, in this exemplary embodiment, the capacitor 90 has a voltage rating of 500 V. The positive end of the capacitor 90 is connected to the positive output of the bridge rectifier 80. The negative end of the capacitor 90 is connected to the negative (return) of the bridge rectifier 80. Other capacitors, such as ceramic capacitors that are not polarity sensitive and may be used as known to a person of ordinary skill in the art.

Optional filter 100 may be used to reduce at least one of the following:
i) conducted emissions;
ii) radiated emissions;
iii) inrush current;
iv) voltage transients;
v) further voltage potential fluctuation;
vi) and combinations thereof.

Depending on the required need for the filter, each filter will comprise various components. A plurality of filters may be connected to each other in series. For example the following tables provide alternative combinations of each filter circuit as needed. FIG. 1B is described in the two tables as follows:

| | Conducted emissions filter, Radiated emissions filter, voltage fluctuation filter | | |
|---|---|---|---|
| Designator | Configuration 1 | Configuration 2 | Configuration 3 |
| A | Optional: not populated/Capacitor | Optional: not populated/Capacitor | Optional: not populated/Resistor |
| B | Resistor | Inductor | Inductor |
| C | Capacitor | Capacitor | Resistor |

| | Transient Suppressor filter | | |
|---|---|---|---|
| Designator | Configuration 1 | Configuration 2 | Configuration 3 |
| A | TVS Diode | MOV | Varistor |
| B | not populated | not populated | not populated |
| C | not populated | not populated | not populated |

As described above, three configurations are disclosed for filters such as conducted emissions, radiated emissions and voltage fluctuations. Similarly, three configurations are disclosed for transient suppressor filters.

Figure 1C:
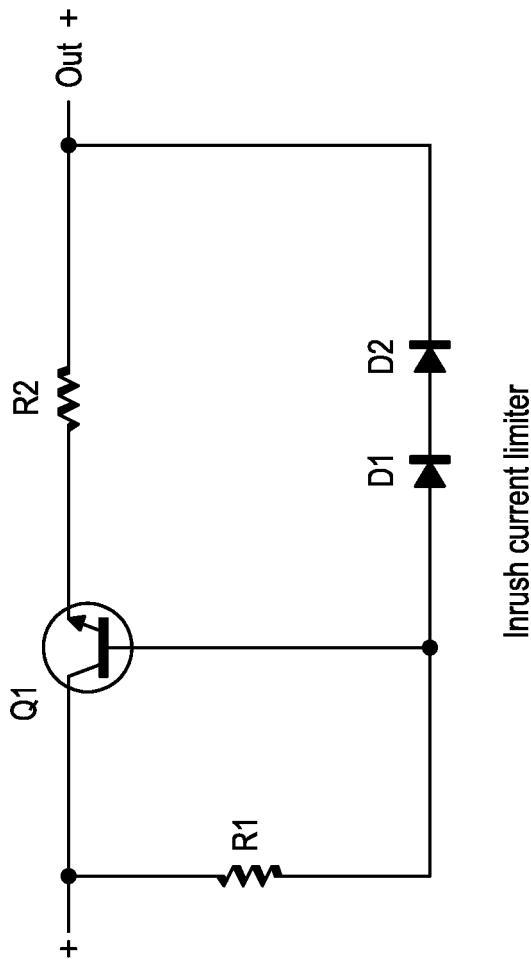
FIG. 1C is a schematic diagram of exemplary optional filter designs for filtering inrush current.

FIG. 1C depicts a circuit layout for filtering and/or limiting inrush current in the PCB. As may be seen in FIG. 1C resistor R1, diodes D1 and D2 may be optional, resistor R2 and transistor Q1 are mandatory.

Referring back to FIG. 1, a current load 110 is in communication with optional filter 100. The current load 110 in this alternative comprises an LED driver and at least one LED known to persons of ordinary skill in the art. An example is AL9910A-5SP-13 manufactured by DIODES®

Incorporated. The configuration of the circuits described in system 10 provides a constant current source over a limited voltage range.

Figure 2:
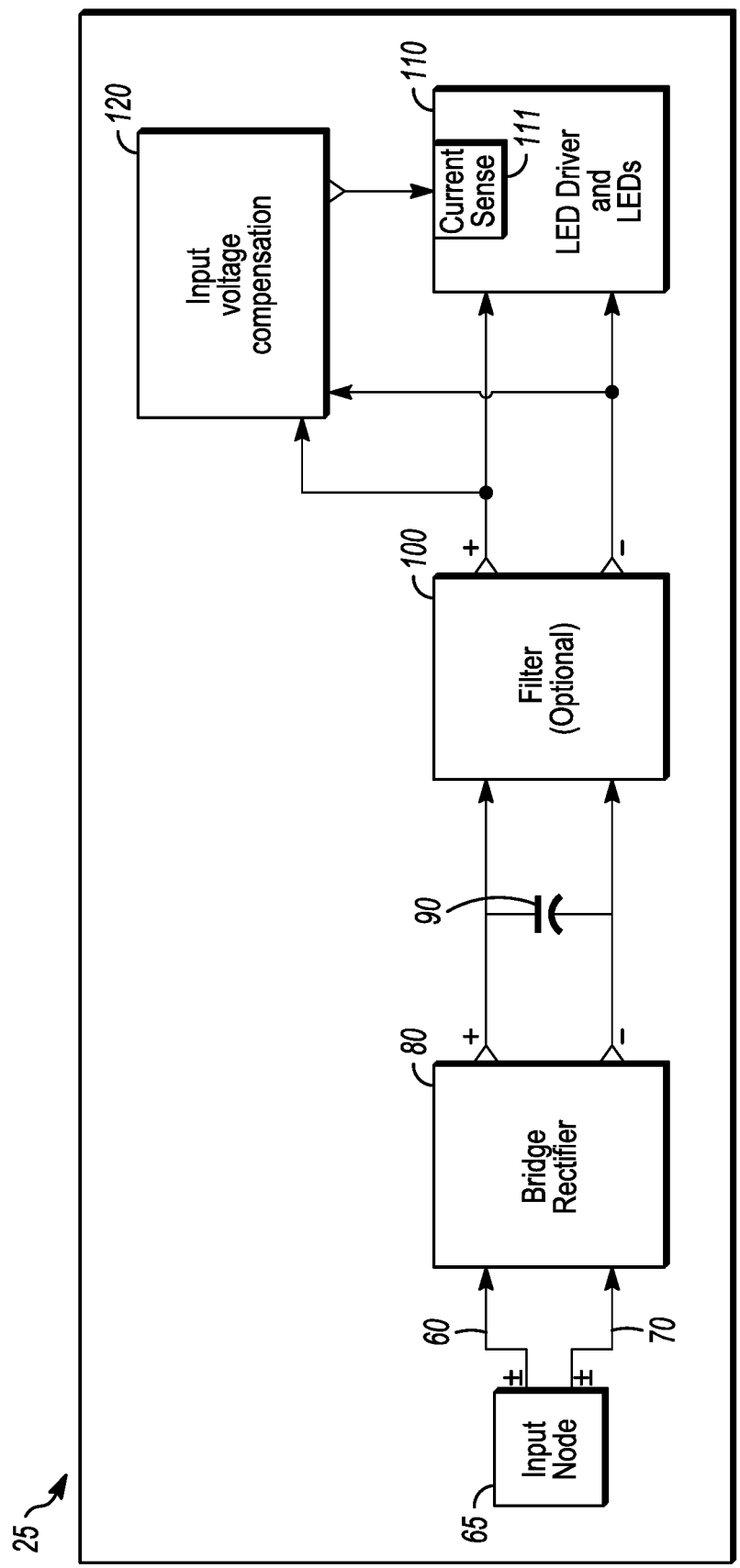
FIG. 2 is a block diagram of an embodied continuous power transmission management system with wide range of input power on a PCB, with LED intensity control.

FIG. 2 depicts a circuit board 25 that provides a constant current over a wide range of input voltage, according to another embodiment of the invention. In addition to the components of the PCB as described in FIG. 1, an input voltage compensation unit 120 is used to regulate the voltage variance and provide a constant output current to the load 110. The input voltage compensation unit 120 is placed between the optional filter 100 and the load 110. In the absence of the optional filter 100, input voltage compensation unit 120 may be coupled directly to the capacitor 90. The output of the voltage compensation unit 120 may be connected to the load 110 via a current sense (CS) pin 111.

Figures 3A, 3B, 3C:
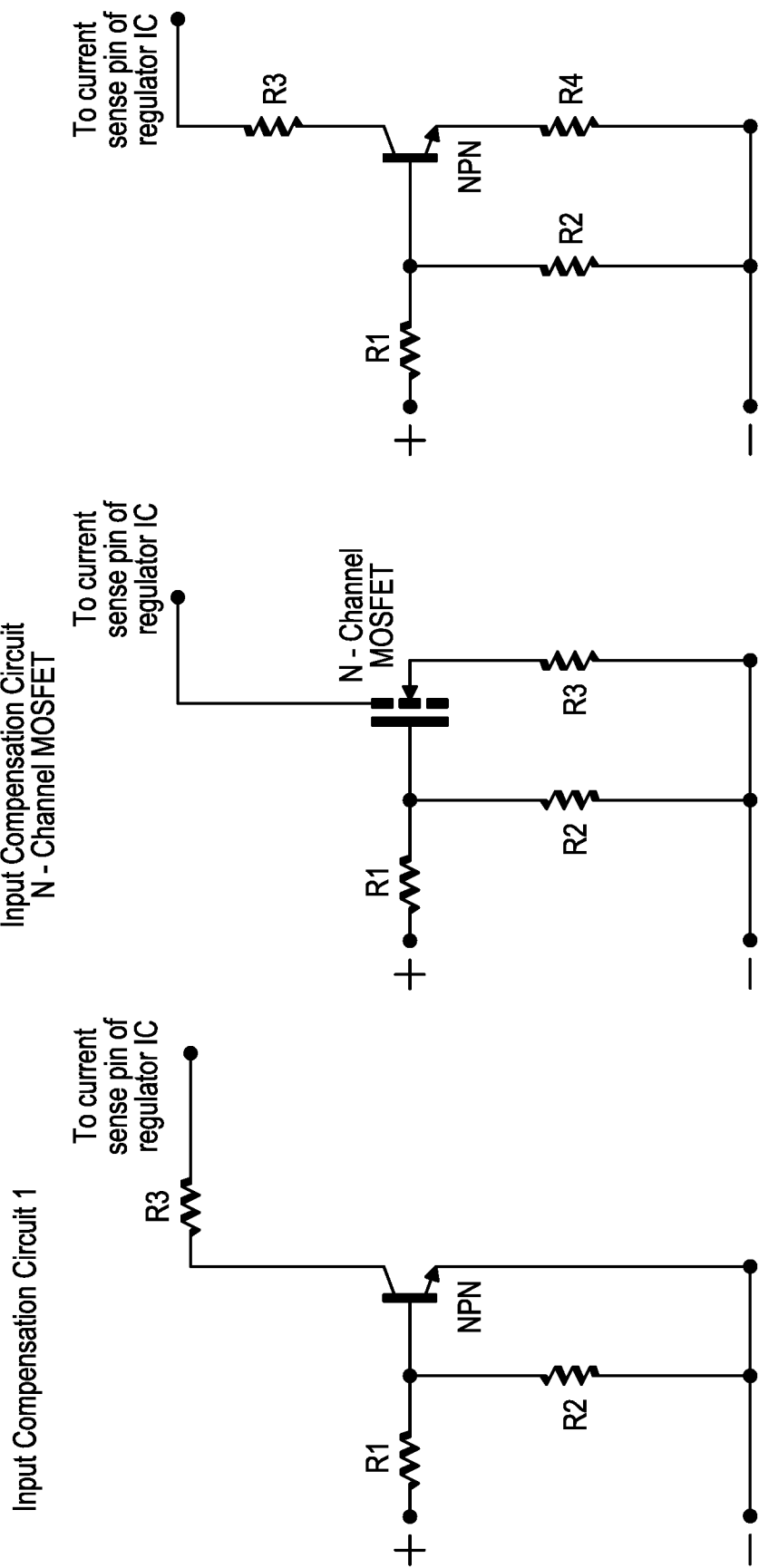
FIGS. 3A, 3B and 3C is a schematic diagram of more than one input voltage compensation circuit.
Figure 5:
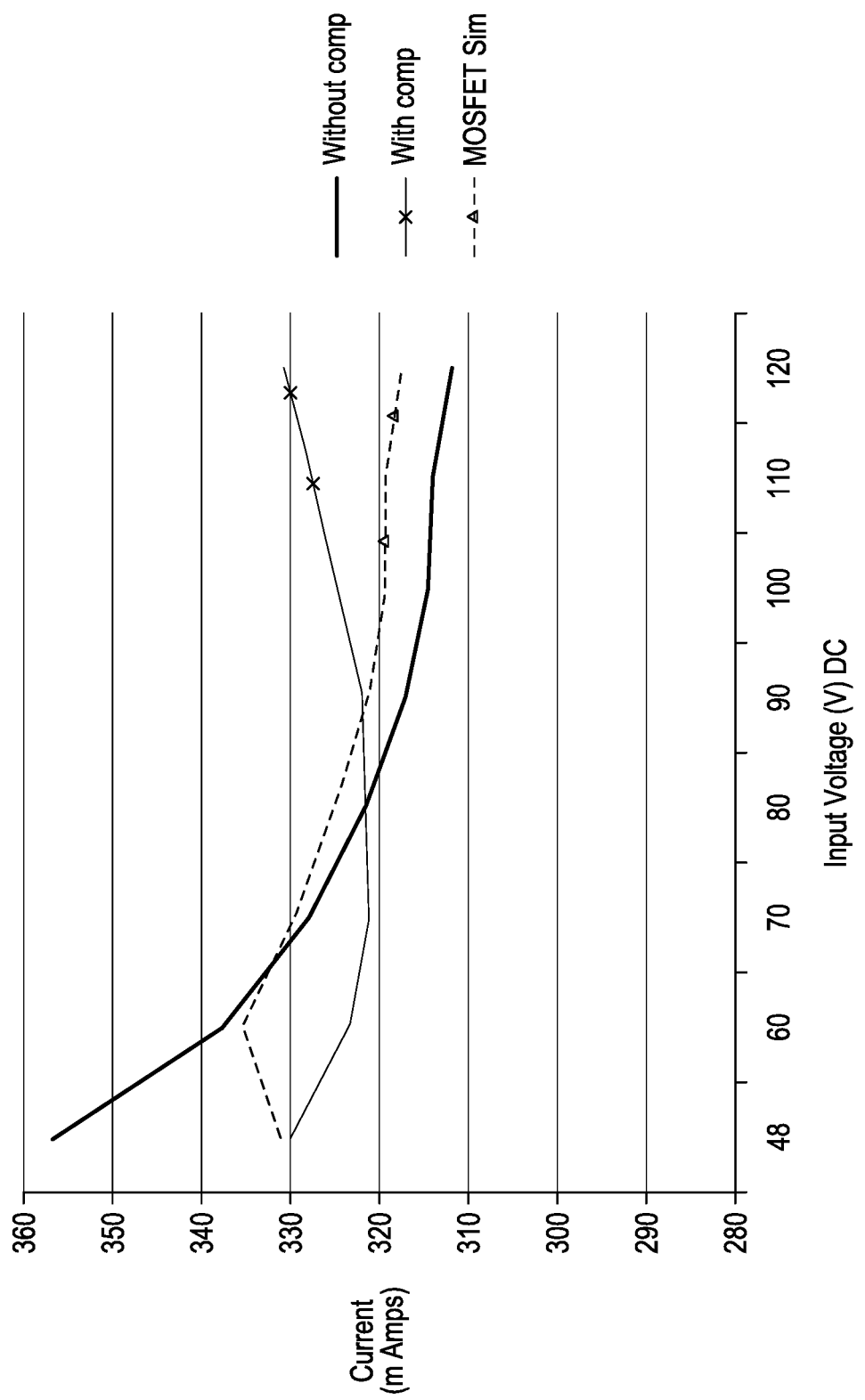
FIG. 5 is a chart depicting the effect of a compensation circuit in the continuous power transmission management system.

Input voltage compensation circuit 120 comprises in one alternative, as shown in FIG. 3A, at a minimum at least one biasing resistor R2 in communication with at least one of a base or an emitter of at least one NPN transistor, and optionally at least a resistor R3 in communication between a collector of said at least one NPN transistor and said at least one current load 110. Alternatively, FIG. 3B depicts an input voltage compensation circuit 120 of at least one biasing resistor in communication with at least one of a gate or a drain of at least one N-channel MOSFET, and optionally at least another resistor in communication between a source of said at least one N-channel MOSFET and said at least one current load. In the example of FIG. 3A, where R1=26.5 kOhms, R2=10 kOhms and R3=0.47 kOhms, and where a CZT5551 transistor have been used, and in FIG. 3B where R1=111.5 kOhms, R2=10 kOhms, R3=1 Ohm and where a BSZ42DN25NS3 MOSFET has been used, the following table shows the resulting current load in the third and fourth columns respectively for a variety of input voltages in the first column. In FIGS. 3A, 3B and 3C, the role of R1 is limit current and set the biasing for the transistor. The second column lists the current load for the same voltages without the above compensation circuit. The current load with the compensation circuits are considerably more uniform than the current load without the compensation circuit. FIG. 5 depicts a chart showing current fluctuation with the circuit board without a compensation circuit, with a single compensation circuit and with multiple compensation circuits. As can be seen the current in the board with no compensation circuit fluctuates widely compared to the board with a compensation circuit.

| Input Voltage (VDC) | Current load without compensation circuit (mA) | Current load with compensation circuit (mA) | Simulated Current load with N-channel MOSFET compensation circuit (mA) |
|---|---|---|---|
| 40 | 356.6 | 329.8 | 331.1 |
| 60 | 337.5 | 323.4 | 335.3 |
| 70 | 327.9 | 321 | 329.5 |
| 80 | 321.6 | 321.4 | 324.9 |
| 90 | 317.1 | 321.9 | 321.4 |
| 100 | 314.5 | 324.9 | 319.4 |
| 110 | 313.9 | 327.4 | 319.3 |
| 120 | 311.9 | 330.8 | 317.6 |

FIG. 3C shows an example where the circuit of FIG. 3A includes an additional resistor, R4 at the output of the NPN transistor. Although not shown, a variant of FIG. 3B may also include a resistor from the N-Channel MOSFET to the current sense pin (similar to FIG. 3C).

According to another embodiment, an alternative way to achieve consistent intensity over wide range of input power is to use multiple iterations of the compensation circuit. More number of iterations reduces output current fluctuations and variants in response to the input voltage range. MosFETs, op-amps or micro-controllers may be used to achieve compensation.

The compensation network feeds into the current sense (CS) pins of the IC, as shown in FIGS. 2 and 3A-3C. However, similar results could be achieved if these compensation networks fed into the Frequency setting pin (Rosc). That would allow for a variable switching frequency which when configured properly could make Rosc dependent on input voltage (Eq. 2), and in turn relieve the voltage dependency for the load current ($I_{LED}$ in Eq.1).

In another embodiment, a negative compensation network may be used to make use of the Linear Dimming inputs that are typical to the wide range ICs. If making use of a digital dimming pin, a voltage controlled variable Pulse Width Modulation (PWM) output circuit could be developed. The output of this circuit would feed into the digital (PWM) dimming input of the IC.

Figure 4:
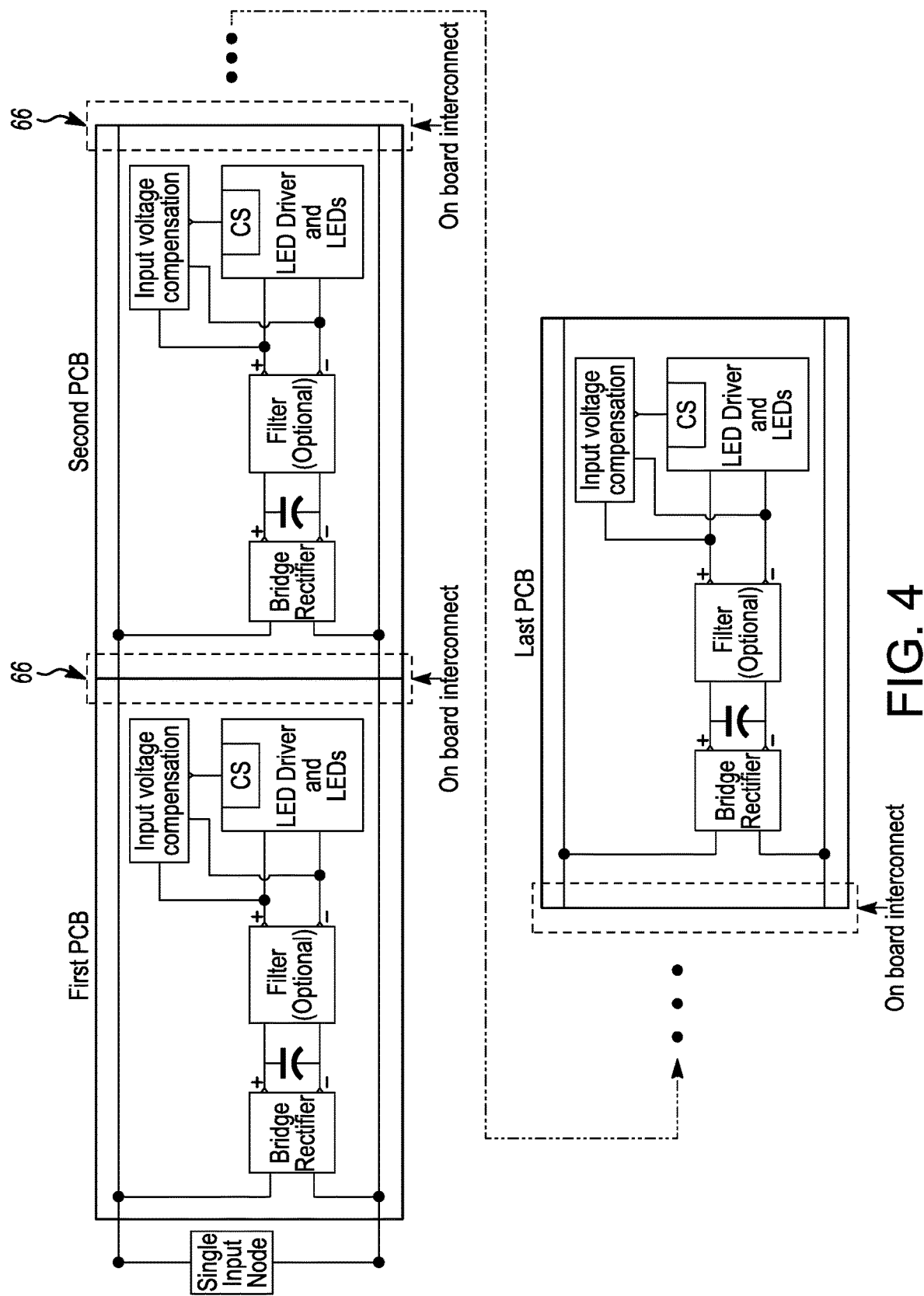
FIG. 4 is a schematic diagram showing a number of interconnected PCBs.

Now referring to FIG. 4, a plurality of the PCBs as described above in reference to FIG. 2 are shown interconnected. Currently the PCB length is limited to 60" in compliance with the industry standards. In one embodiment, in order to achieve long runs in a system, multiple PCBs are combined. The PCBs are connected through end connectors 66 that provides the on board interconnection for creating a continuous system. As such, the overall length of PCBs may vary depending on the application. Interconnection of the boards may be enabled by any connection type, including but not limited to SMT connectors, Blade connectors, Poke-in connectors, terminal blocks, and soldered wire leads.

Figures 1, 9B:
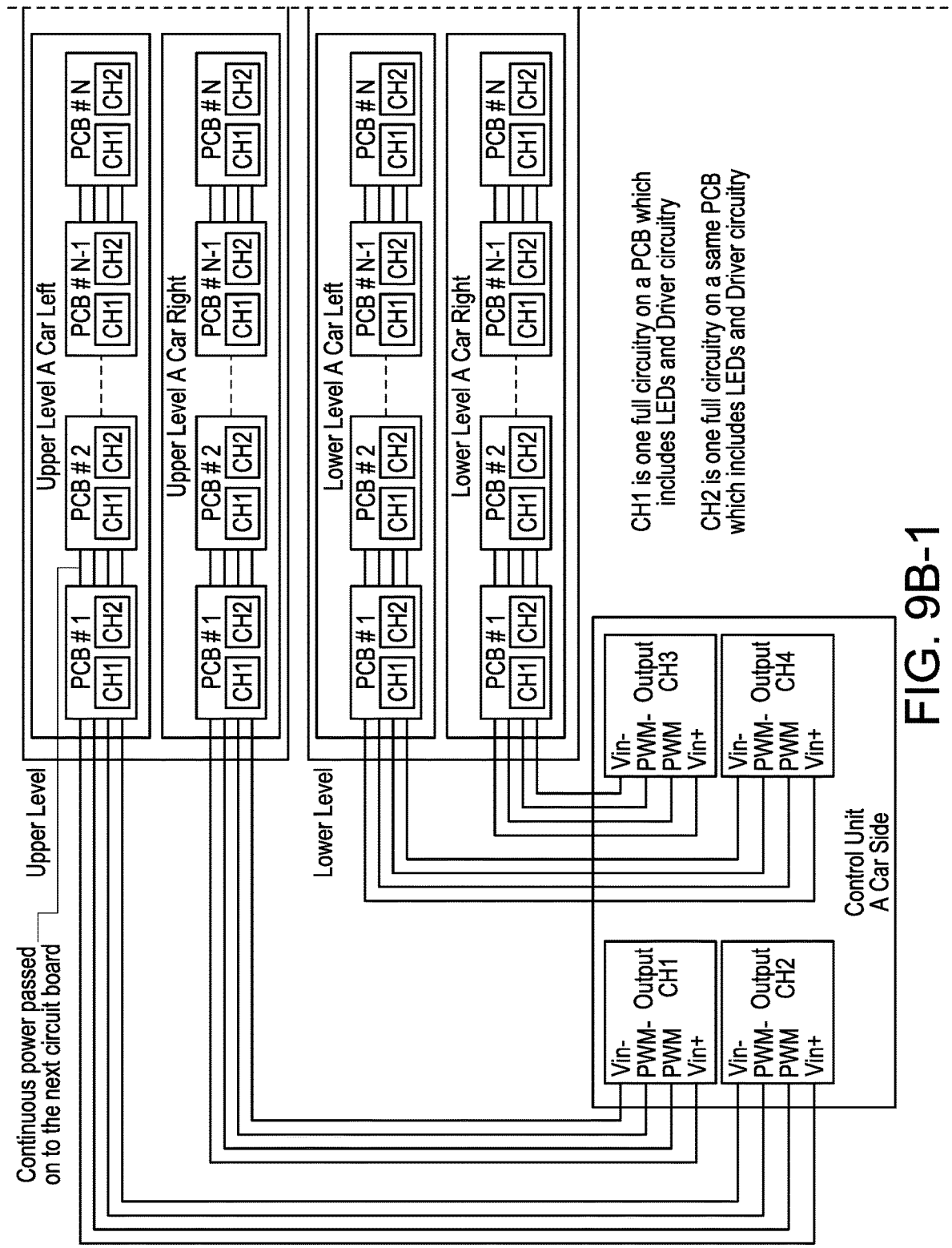
Figures 2, 9B:
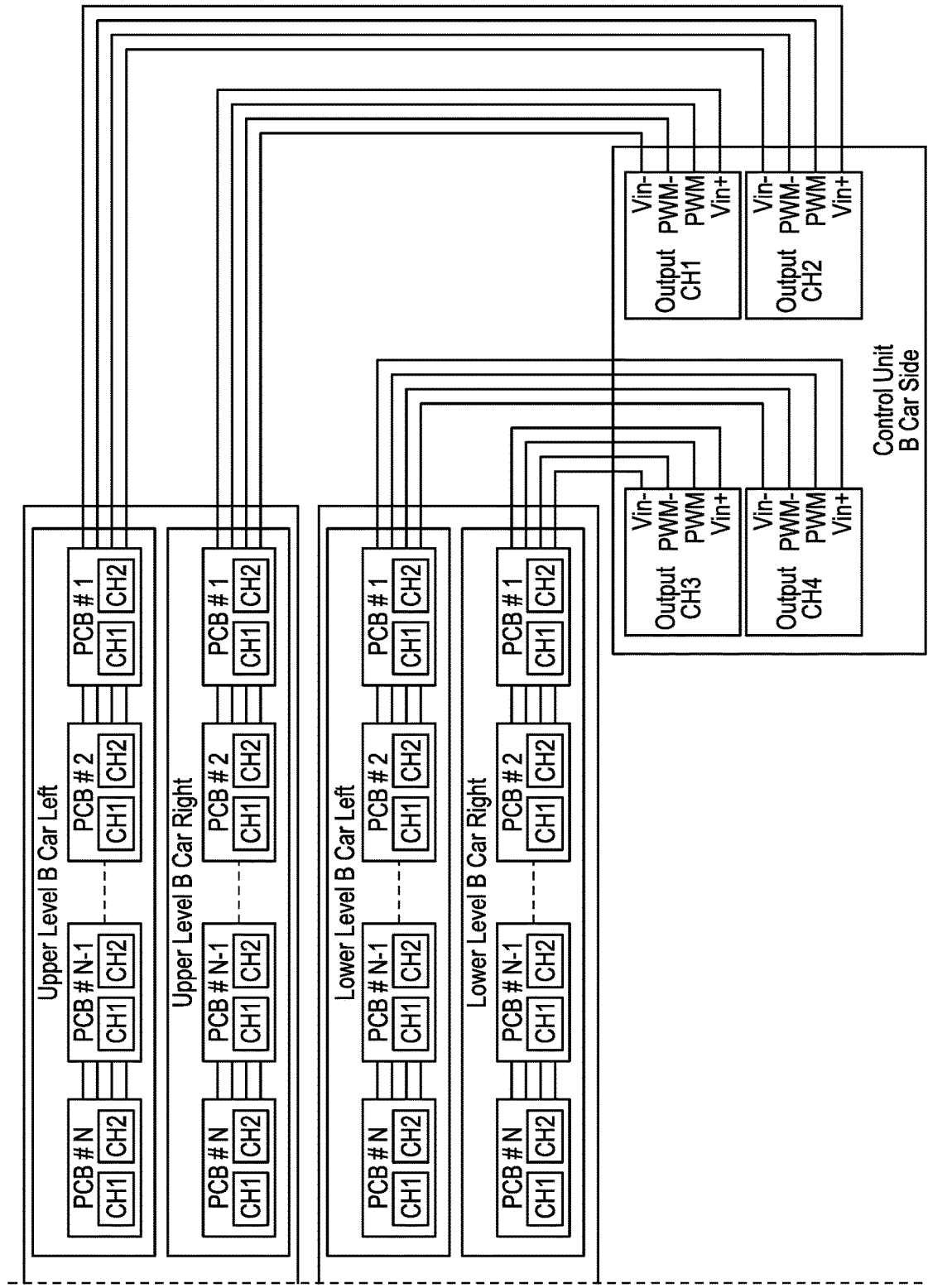

Referring now to FIGS. 9A and 9B, FIG. 9A depicts a complete floor plan of a train car. A singular train car consists of two sections, A car side and B car side. There is also shown a lower lever and upper level of a bi-level train car.

FIG. 9B is a wiring diagram showing how continuous power is passed via a single entry point through multiple PCB boards on the upper and lower level of A car side and B car side. It shows that both A car side and B car side have their designated control units. 4 output channels are used to control power for upper and lower levels and for left and right sides of the car.

In one alternative (See FIGS. 9A-1, 9A-2, 9B-1 and 9B-2), the PCBs are used as follows: PCB assemblies are installed on a bi-level train having an upper level and a lower level. A total of 119 PCB assemblies (or boards) are used in a continuous power application. In this application, the boards are split into 8 circuits; lower level A car left, lower level A car right, upper level A car left, upper level A car right, lower level B car left, lower level B car right, upper level B car left, and upper level B car right. Each one of these aforementioned circuits has a single entry node into its respective continuous power string. The length (and number of boards) in each string are respectively, 32 feet (16 boards), 32 feet (16 boards), 32 feet (16 boards), 32 feet (16 boards), 32 feet (16 boards), 22 feet (11 boards), 32 feet (16 boards) and 24 feet (12 boards). Depending on in-service characteristics, the power fed to each of these strings can be either 120 VAC nominal (80-140 VAC), or 37.5 VDC nominal (20-45 VDC).

FIG. 10 depicts a typical interior of a transit vehicle with a transit light assembly 10-1.

Example 1

The following is an example of an alternative of the present disclosure and how it achieves constant LED drive current and constant LED light intensity.

Equipment

GW Instek Power supply, model PSW160-21.6, SN:GE0215052, Calibration cert:40715, Calibration date: 15 Dec. 2016

Gigahertz-optik photo sensor, model VL-3701-4, SN: 35074, Calibration: 1642622-WERK, Calibration date: January 2017

Fluke Multimeter, model 177, SN: 40820352, Calibration: 44177, Calibration date: 24 Jan. 2018

Procedure

Setup a light meter approximately 5 inches away from the LED light source;

Select dial on a multimeter to mA/A position and connect it in line with the LED string to measure LED drive current;

Turn on the power supply and setup the input voltage at 34 VDC;

Record the light level and measured LED drive current;

Increase input voltage and record the light level and LED drive current for each of the input voltage levels up to 168 VDC.

FIG. 6A-6D shows the schematic diagram of the printed circuit board used in this example depicting how the current sense pin CS, linear dimming pin LD, frequency set pin RT and pulse width modulation pin PWMD of the IC AL9910A-5SP-13 are connected with the rest of the circuitry to achieve the desired LED drive current and switching frequency. A magnified view of the LED Driver IC U2 (AL9910A-5SP-13) is shown here. The inset table shows all the pin numbers and pin description of IC U2. It can be seen that pin #1 is the input voltage pin and is connected to Capacitor C11 (to a Pi filter). Pin #2 is a current sense pin and is connected to resistor R29 which senses the switch current through the LED string and external MOSFET. In this experiment it is also connected to the single to multi stage compensation network. Pin #3 is a GND pin and is connected to a V− node (Return path) of the circuit. Pin #4 is connected to the Gate of the external MOSFET Q6 (STL4N80K). Pin #5 is a low frequency PWM dimming pin and is connected to capacitor C16 and pin #6 VDD. Pin #6 is a VDD pin which is an internally regulated supply voltage. Pin #6 is also connected to an external storage capacitor C16. Pin #7 is a Linear Dimming input pin connected to pin VDD and capacitor C16. Pin #8 is a Rosc (Oscillator control) pin connected to a resistor R33, and used to select a desired switching frequency. The exposed pad on the bottom of the IC is directly connected to V− (return path) node.

Figure 6A:
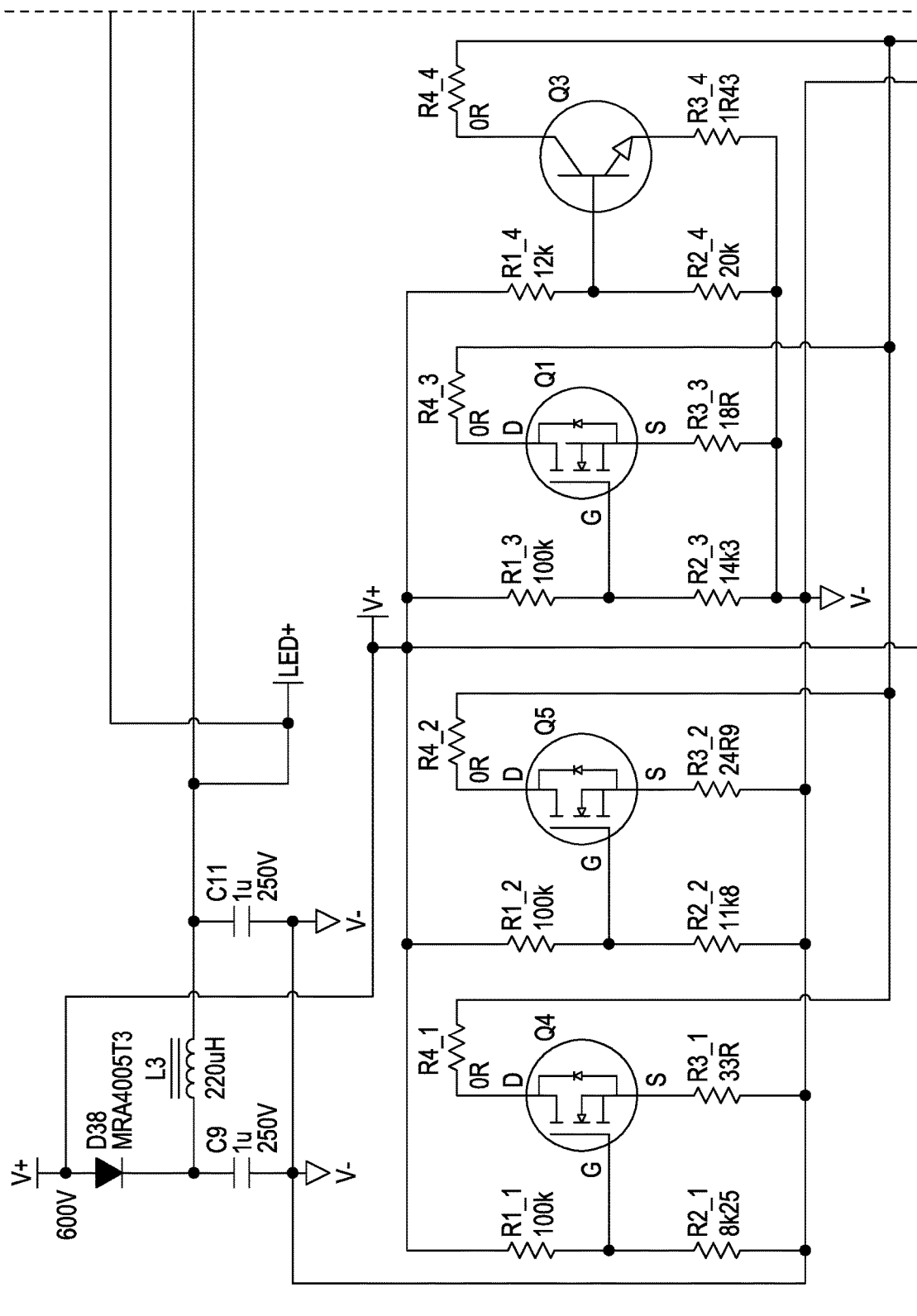
FIG. 6A-6D depicts a schematic diagram of a circuit used in Example 1.
Figure 6B:
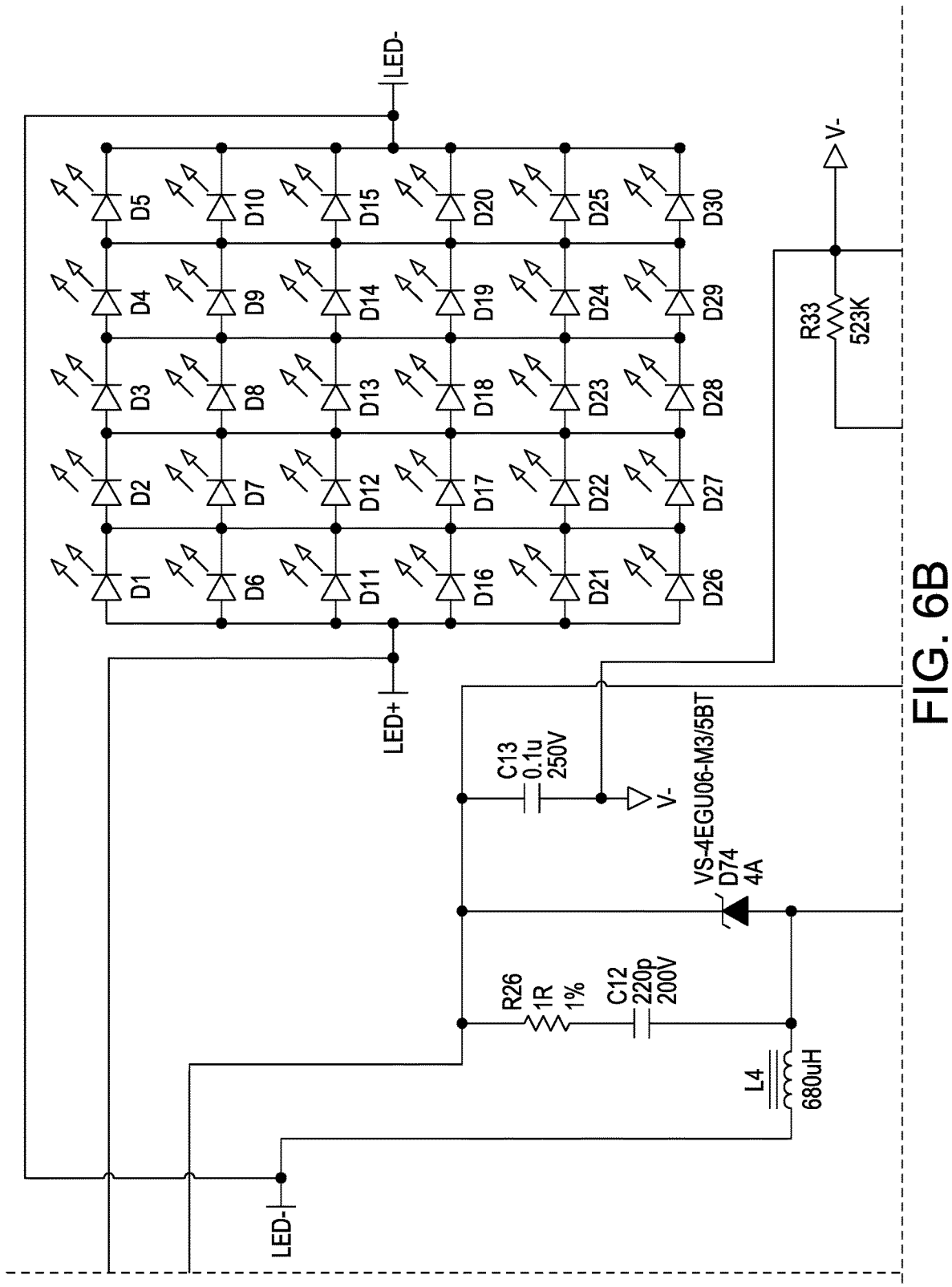
Figure 6C:
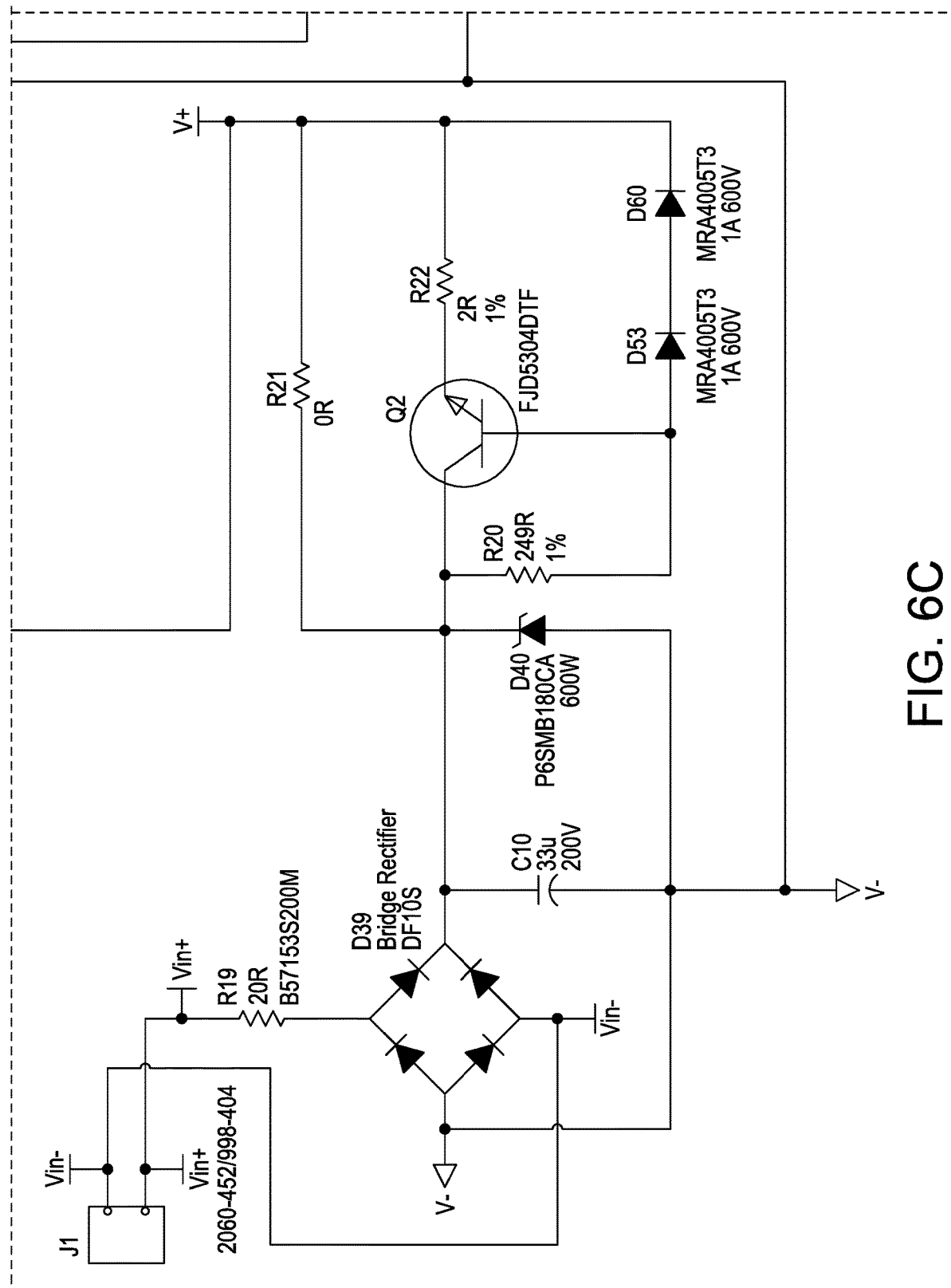
Figure 6D:
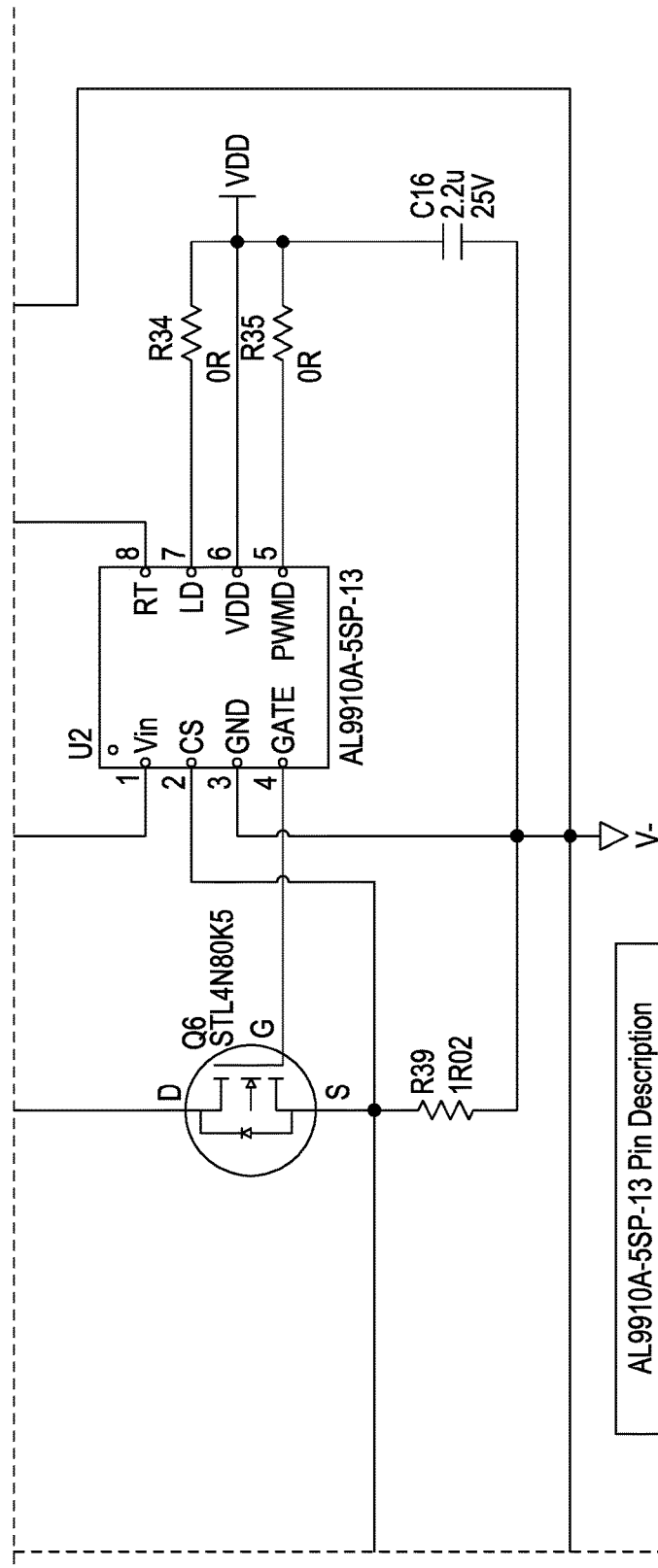

In FIG. 6C, input voltage Vin is applied via connector J1. Which is then connected to an Inrush current limiter (ICL) R19 which limits any inrush current coming from the input line. The next stage is a Bridge Rectifier D39 to rectify the input voltage and a capacitor input filter, C10, to produce DC voltage from the rectified voltage. The next stage is an In-rush current limiter circuitry comprising Q2, R20, R22, D53 and D60. The resistance values of each of R20 and R22 are chosen such that the biasing of transistor Q2 limits the In-rush current coming from the input line. In this example, the circuit comprising the components Q2, R20, R22, D53 and D60 is bypassed using a jumper resistor R21. After bypassing via jumper resistor R21, power passes through diode D38, a reverse polarity protection diode, to the Pi filter comprising a capacitor C9, connected to an inductor L3 connected to a capacitor C11. Given the output voltage coming from the rectifier consists of AC components, it is important to remove these AC ripples before the voltage is applied to the Vin pin of the IC U2. The output voltage from the Bridge Rectifier D39 is directly connected to the input capacitor C10 which provides a low impedance path to AC ripples present and high resistance to DC voltage. Most of the AC ripples get bypassed through the capacitor input stage only C10. The residual AC components which are still present in the filtered DC signal get filtered when they pass through inductor L3, providing high impedance to AC and low resistance to DC, and through capacitor C11. In this manner, the efficiency of the filtering may be increased. When an input voltage is applied to pin #1 of IC U2, pin #4 (Gate pin) exhibits a voltage higher than the threshold voltage, turning ON the external MOSFET Q6 causing the current to flow through the LEDs, Inductor L4 and current sense resistor R29. When the voltage across R29 (Rsense) exceeds the current sense pin threshold the external MOSFET Q6 is turned off. The stored energy in the inductor L4 causes current to flow through the LEDs via re-circulative diode D74. From the recorded data described herein, when there is no compensation network present, there is almost a 31% variation in the LED drive current and thus a variation in the light intensity over the full voltage range from 34 VDC to 168 VDC. A compensation circuitry compensates for this reduction of the LED drive current and light intensity as the input voltage increases from 34 VDC to 168 VDC. The relationship of reduction of the LED drive current and light intensity as the voltage increases is not linear. As the voltage increases from 34 VDC to 90 VDC there is a 29% reduction in the LED drive current and light intensity while there is approximately 1% of fluctuation from 90 VDC to 168 VDC. The addition of a single to multi stage compensation network will compensate against this drop in the LED drive current for a desired input voltage range. Resisters R1_1 and R2_1 are used to configure the biasing of MOSFET Q4. Similarly R1_2 and R2_2 are the biasing resistors for MOSFET Q5, R1_3 and R2_3 for MOSFET Q1 and R1_4 and R2_4 for transistor Q3. As the MOSFETs Q4, Q5 and Q1 and transistor Q3 turn on at different input voltages due to its different biasing, Resistors R3_1, R3_2, R3_3 and R3_4 get in parallel to the sense resistor R29 causing the overall Rsense to drop resulting in an increase in LED drive current. This increase in LED drive current works as the compensation to the decrease in LED drive current when there is no compensation network present resulting in a consistent LED drive current and light intensity.

The table below shows a complete list of components in FIG. 6A-6D of the schematic in detail. It shows type of component, designator, quantity, value and manufacturer details. Other equivalent components/manufacturers may be sourced.

| Component Type | Designator | Quantity | Value | Manufacturer | Manufacturer PN |
| --- | --- | --- | --- | --- | --- |
| Capacitor | C9, C11 | 2 | 1 uF | TDK | C4532X7T2E105M250KE |
| Capacitor | C10 | 1 | 33 uF | Nichicon | ULR2D330MNL1GS |

-continued

| Component Type | Designator | Quantity | Value | | Manufacturer | Manufacturer PN |
|---|---|---|---|---|---|---|
| Capacitor | C12 | 1 | 220 | pF | Yageo | CC0805KRX7RABB221 |
| Capacitor | C13 | 1 | 0.1 | uF | TDK | C2012X7T2E104M125AE |
| Capacitor | C16 | 1 | 2.2 | uF | Samsung | CL21B225KAFVPNE |
| LED (light emitting diode) | D1, D2, D3, D4, D5, D6, D7, D8, D9, D10, D11, D12, D13, D14, D15, D16, D17, D18, D19, D20, D21, D22, D23, D24, D25, D26, D27, D28, D29, D30 | 30 | | | Seoul Semiconductor | STW8Q14D-EMC |
| General purpose Diode | D38, D53, D60 | 3 | 1 | A | ON Semiconductor | MRA4005T3 |
| Bridge Rectifier | D39 | 1 | | | Fairchild | DF10S |
| TVS Diode | D40 | 1 | 154 | V | Littlefuse | P6SMB180CA |
| General purpose Diode | D74 | 1 | 600 | V | Vishay | VS-4EGU06-M3/5BT |
| Connector | J1 | 1 | | | Wago | 2060-452/998-404 |
| Inductor | L3 | 1 | 220 | uH | Coiltronics | DR73-221-R |
| Inductor | L4 | 1 | 680 | uH | Bourns | SRR1208-681 |
| N-Channel MOSFET | Q1, Q4, Q5 | 3 | | | STMicroelectronics | STN3N40K3 |
| NPN Transistor | Q2 | 1 | | | Fairchild Semiconductor | FJD5304DTF |
| NPN Transistor | Q3 | 1 | | | NXP Semiconductors | PZTA42,115 |
| N-Channel MOSFET | Q6 | 1 | | | STMicroelectronics | STL4N80K5 |
| Resistor | R1_1, R1_2, R1_3 | 3 | 100 | kOhm | Yageo | RC0805FR-07100KL |
| Resistor | R1_4 | 1 | 12 | kOhm | Yageo | RC0805FR-0712KL |
| Resistor | R2_1 | 1 | 8.25 | kOhm | Yageo | RC0805FR-078K25L |
| Resistor | R2_2 | 1 | 11.8 | kOhm | Yageo | RC0805FR-0711K8L |
| Resistor | R2_3 | 1 | 14.3 | kOhm | Yageo | RC0805FR-0714K3L |
| Resistor | R2_4 | 1 | 20 | kOhm | Yageo | RC0805FR-0720KL |
| Resistor | R3_1 | 1 | 33 | Ohm | Yageo | RC0805FR-0733RL |
| Resistor | R3_2 | 1 | 24.9 | Ohm | Yageo | RC0805FR-0724R9L |
| Resistor | R3_3 | 1 | 18 | Ohm | Yageo | RC0805FR-0718RL |
| Resistor | R3_4 | 1 | 1.43 | Ohm | Yageo | RC0805FR-071R43L |
| Resistor | R4_1, R4_2, R4_3, R4_4 | 4 | 0 | Ohm | Stackpole Electronics | RMCF0805ZT0R00 |
| Inrush Current Limiter (ICL) | R19 | 1 | 20 | Ohm | EPCOS | B57153S200M |
| Resistor | R20 | 1 | 249 | Ohm | Yageo | RC1206FR-07249RL |
| Resistor | R21 | 1 | 0 | Ohm | Stackpole Electronics | RMCF1206ZG0R00 |
| Resistor | R22 | 1 | 2 | Ohm | Stackpole Electronics Inc. | RMCF1210FT2R00 |
| Resistor | R26 | 1 | 1 | Ohm | Stackpole Electronics | RMCF0805FT1R00 |
| Resistor | R29 | 1 | 1.02 | Ohm | Yageo | RC0805FR-071R02L |
| Resistor | R33 | 1 | 523 | kOhm | Stackpole Electronics | RMCF0805FT523K |
| Resistor | R34, R35 | 2 | 0 | Ohm | Stackpole Electronics | RMCF0805ZT0R00 |
| LED Driver IC | U2 | 1 | | | Diodes Incorporated | AL9910A-5SP-13 |

FIG. 6A also shows how a 4-stage compensation network (3 MOSFETS, Q4, Q5 and Q1 and 1 Transistor, Q3) is connected to the current sense pin of the IC AL9910A-5SP-13. Without any compensation network the LED drive current and light intensity decreases as the Input voltage increases from 34 VDC to 168 VDC. However LED drive current and light intensity is kept constant by connecting at least a single-stage compensation network to at least a multi-stage compensation network to the current sense pin of the IC AL9910A-5SP-13 as shown in FIG. 6. Below are the recorded data outlining the benefits of various compensation networks as per the present disclosure.

Tabulated Results

Tables 1.1, 1.2 and 1.3 below show measured LED drive current and relative light intensity, respectively, over the voltage range from 34 VDC to 168 VDC when there is no compensation network.

TABLE 1.1

| | | |
|---|---|---|
| Minimum current over full voltage range | 165 | mA |
| Maximum current over full voltage range | 239 | mA |
| Percentage difference in current | 30.9623431 | % |

TABLE 1.2

| | | |
|---|---|---|
| Minimum Relative light intensity over full voltage range | 0.80045872 | |
| Maximum Relative light intensity over full voltage range | 1.15366972 | |
| Percentage difference in relative light intensity | 30.6163022 | % |

TABLE 1.3

Without the compensation network

| Input Voltage (V) | Drive Current (mA) | Relative Light Intensity |
|---|---|---|
| 34 | 239 | 1.15366972 |
| 35 | 235.1 | 1.13302752 |
| 40 | 218.3 | 1.05504587 |
| 45 | 206.6 | 1 |
| 50 | 198 | 0.95642202 |
| 55 | 191.2 | 0.9266055 |
| 60 | 185.8 | 0.90137615 |
| 65 | 181.2 | 0.88073394 |
| 70 | 178 | 0.86009174 |
| 75 | 174.8 | 0.85091743 |
| 80 | 172.5 | 0.84174312 |
| 85 | 171 | 0.82110092 |
| 90 | 169.4 | 0.81880734 |
| 95 | 167.6 | 0.81422018 |
| 100 | 166.8 | 0.81192661 |
| 105 | 166 | 0.80733945 |

TABLE 1.3-continued

Without the compensation network

| Input Voltage (V) | Drive Current (mA) | Relative Light Intensity |
|---|---|---|
| 110 | 165.8 | 0.80504587 |
| 115 | 165.4 | 0.80275229 |
| 120 | 165.2 | 0.80045872 |
| 125 | 165 | 0.80045872 |
| 130 | 165.2 | 0.80275229 |
| 135 | 165.2 | 0.80275229 |
| 140 | 166 | 0.80504587 |
| 145 | 166.3 | 0.80963303 |
| 150 | 167 | 0.80963303 |
| 155 | 167.6 | 0.81422018 |
| 160 | 168.2 | 0.81651376 |
| 165 | 168.5 | 0.81880734 |
| 168 | 168.7 | 0.81880734 |

Tables 2.1, 2.2 and 2.3 below show measured LED drive current and relative light intensity, respectively, over the voltage range from 34 VDC to 168 VDC when 1 transistor compensation network is implemented.

TABLE 2.1

| | | |
|---|---|---|
| Minimum current over full voltage range | 203.9 | mA |
| Maximum current over full voltage range | 225.9 | mA |
| Percentage difference in current | 9.73882249 | % |

TABLE 2.2

| | | |
|---|---|---|
| Minimum Relative light intensity over full voltage range | 0.98356808 | |
| Maximum Relative light intensity over full voltage range | 1.08920188 | |
| Percentage difference in relative light intensity | 9.69827586 | % |

TABLE 2.3

With 1 Transistor compensation network

| Input Voltage (V) | Drive Current (mA) | Relative Light Intensity |
|---|---|---|
| (R = 0.91), Rsens = 1, R4 = 12k, R3 = 20k | | |
| 34 | 217.9 | 1.051643192 |
| 35 | 216.45 | 1.044600939 |
| 40 | 210.3 | 1.014084507 |
| 45 | 207 | 1 |
| 50 | 205.1 | 0.995305164 |
| 55 | 204.2 | 0.983568075 |
| 60 | 203.9 | 0.983568075 |
| 65 | 203.9 | 0.983568075 |
| 70 | 204.2 | 0.985915493 |
| 75 | 205 | 0.988262911 |

TABLE 2.3-continued

With 1 Transistor compensation network

| Input Voltage (V) | Drive Current (mA) | Relative Light Intensity |
|---|---|---|
| 80 | 205.6 | 0.990610329 |
| 85 | 206.3 | 0.992957746 |
| 90 | 207.2 | 0.997652582 |
| 95 | 208 | 1.002347418 |
| 100 | 209 | 1.009389671 |
| 105 | 210 | 1.014084507 |
| 110 | 211 | 1.018779343 |
| 115 | 212.3 | 1.023474178 |
| 120 | 213.6 | 1.028169014 |
| 125 | 214.2 | 1.03286385 |
| 130 | 215.5 | 1.039906103 |
| 135 | 216.9 | 1.044600939 |
| 140 | 218.5 | 1.051643192 |
| 145 | 219.3 | 1.058685446 |
| 150 | 220.7 | 1.063380282 |
| 155 | 222.2 | 1.070422535 |
| 160 | 222.2 | 1.075117371 |
| 165 | 224.4 | 1.084507042 |
| 168 | 225.9 | 1.089201878 |

Tables 3.1, 3.2 and 3.3 below show measured LED drive current and relative light intensity, respectively, over the voltage range from 34 VDC to 168 VDC when 2 Transistor compensation networks are implemented.

TABLE 3.1

| | | |
|---|---|---|
| Minimum current over full voltage range | 206.1 | mA |
| Maximum current over full voltage range | 221.9 | mA |
| Percentage difference in current | 7.12032447 | % |

TABLE 3.2

| | | |
|---|---|---|
| Minimum Relative light intensity over full voltage range | 0.98853211 | |
| Maximum Relative light intensity over full voltage range | 1.066513761 | |
| Percentage difference in relative light intensity | 7.311827957 | % |

TABLE 3.3

With 2 Transistor compensation network

| Input Voltage (V) | Drive Current (mA) | Relative Light Intensity |
|---|---|---|
| (R = 1.62 ∥ 1.62), Rsens = 1.2, R4 = 12k, R3 = 20k | | |
| 34 | 216.3 | 1.041284404 |
| 35 | 215.2 | 1.03440367 |
| 40 | 210.8 | 1.016055046 |
| 45 | 208.1 | 1 |
| 50 | 207 | 0.993119266 |

TABLE 3.3-continued

With 2 Transistor compensation network

| Input Voltage (V) | Drive Current (mA) | Relative Light Intensity |
|---|---|---|
| 55 | 206.2 | 0.993119266 |
| 60 | 206.1 | 0.990825688 |
| 65 | 206.1 | 0.98853211 |
| 70 | 206.7 | 0.993119266 |
| 75 | 207 | 0.990825688 |
| 80 | 207.5 | 0.997706422 |
| 85 | 208.1 | 1 |
| 90 | 208.9 | 1.004587156 |
| 95 | 209.3 | 1.006880734 |
| 100 | 210 | 1.006880734 |
| 105 | 211 | 1.013761468 |
| 110 | 211.5 | 1.016055046 |
| 115 | 212.5 | 1.020642202 |
| 120 | 213.4 | 1.025229358 |
| 125 | 213.8 | 1.027522936 |
| 130 | 213.7 | 1.025229358 |
| 135 | 214 | 1.029816514 |
| 140 | 215.3 | 1.032110092 |
| 145 | 216.4 | 1.038990826 |
| 150 | 218 | 1.043577982 |
| 155 | 217.4 | 1.04587156 |
| 160 | 218.6 | 1.050458716 |
| 165 | 218.5 | 1.059633028 |
| 168 | 221.9 | 1.066513761 |

Tables 4.1, 4.2 and 4.3 below show measured LED drive current and relative light intensity, respectively, over the voltage range from 34 VDC to 168 VDC when 4 MOSFET compensation networks are implemented.

TABLE 4.1

| | | |
|---|---|---|
| Minimum current over full voltage range | 203.6 | mA |
| Maximum current over full voltage range | 209.7 | mA |
| Percentage difference in current | 2.908917501 | % |

TABLE 4.2

| | | |
|---|---|---|
| Minimum Relative light intensity over full voltage range | 0.981438515 | |
| Maximum Relative light intensity over full voltage range | 1.009280742 | |
| Percentage difference in relative light intensity | 2.75862069 | % |

TABLE 4.3

With 4 MOSFETs compensation network

| Input Voltage (V) | Drive Current (mA) | Relative Light Intensity |
|---|---|---|
| 34 | 207.1 | 1 |
| 35 | 207 | 1 |
| 40 | 207 | 1 |
| 45 | 207.3 | 1 |

TABLE 4.3-continued

With 4 MOSFETs compensation network

| Input Voltage (V) | Drive Current (mA) | Relative Light Intensity |
|---|---|---|
| 50 | 207 | 1 |
| 55 | 206.6 | 0.995359629 |
| 60 | 208.9 | 1.006960557 |
| 65 | 206.7 | 0.995359629 |
| 70 | 205 | 0.988399072 |
| 75 | 207 | 0.997679814 |
| 80 | 209.7 | 1.009280742 |
| 85 | 209.3 | 1.006960557 |
| 90 | 208 | 1.002320186 |
| 95 | 207 | 0.997679814 |
| 100 | 206 | 0.993039443 |
| 105 | 205 | 0.988399072 |
| 110 | 204.4 | 0.983758701 |
| 115 | 204 | 0.983758701 |
| 120 | 203.6 | 0.981438515 |
| 125 | 203.6 | 0.981438515 |
| 130 | 203.6 | 0.981438515 |
| 135 | 203.7 | 0.981438515 |
| 140 | 204.1 | 0.983758701 |
| 145 | 204.3 | 0.983758701 |
| 150 | 204.6 | 0.986078886 |
| 155 | 205.1 | 0.988399072 |
| 160 | 205.6 | 0.990719258 |
| 165 | 206.1 | 0.993039443 |
| 168 | 206.8 | 0.995359629 |

Tables 5.1, 5.2 and 5.3 below show measured LED drive current and relative light intensity, respectively, over the voltage range from 34 VDC to 168 VDC when 3 MOSFET & 1 Transistor compensation network is implemented.

TABLE 5.1

| Minimum current over full voltage range | 201.6 | mA |
|---|---|---|
| Maximum current over full voltage range | 209.6 | mA |
| Percentage difference in current | 3.816793893 | % |

TABLE 5.2

| Minimum Relative light intensity over full voltage range | 0.970183486 | |
|---|---|---|
| Maximum Relative light intensity over full voltage range | 1.006880734 | |
| Percentage difference in relative light intensity | 3.644646925 | % |

TABLE 5.3

With 3 MOSFETs and 1 Transistor compensation network

| Input Voltage (V) | Drive Current (mA) | Relative Light Intensity |
|---|---|---|
| 34 | 206.6 | 0.995412844 |
| 35 | 206.1 | 0.993119266 |
| 40 | 206.7 | 0.995412844 |
| 45 | 207.6 | 1 |
| 50 | 205.3 | 0.98853211 |

TABLE 5.3-continued

With 3 MOSFETs and 1 Transistor compensation network

| Input Voltage (V) | Drive Current (mA) | Relative Light Intensity |
|---|---|---|
| 55 | 205.8 | 0.990825688 |
| 60 | 205.8 | 0.990825688 |
| 65 | 204.6 | 0.983944954 |
| 70 | 203.6 | 0.979357798 |
| 75 | 202.8 | 0.97706422 |
| 80 | 202.3 | 0.972477064 |
| 85 | 201.8 | 0.972477064 |
| 90 | 201.7 | 0.970183486 |
| 95 | 201.6 | 0.970183486 |
| 100 | 201.7 | 0.970183486 |
| 105 | 202 | 0.970183486 |
| 110 | 202 | 0.972477064 |
| 115 | 202.4 | 0.974770642 |
| 120 | 202.7 | 0.97706422 |
| 125 | 203.3 | 0.97706422 |
| 130 | 203.9 | 0.981651376 |
| 135 | 204.8 | 0.986238532 |
| 140 | 205.7 | 0.98853211 |
| 145 | 206.5 | 0.993119266 |
| 150 | 207.3 | 0.995412844 |
| 155 | 207.8 | 0.997706422 |
| 160 | 208.5 | 1.002293578 |
| 165 | 209.1 | 1.004587156 |
| 168 | 209.6 | 1.006880734 |

This example confirms when a single-stage to multi-stage compensation network(s) is implemented, the LED drive current and light intensity remain constant over the full voltage range from 34V to 168V.

Figure 7:
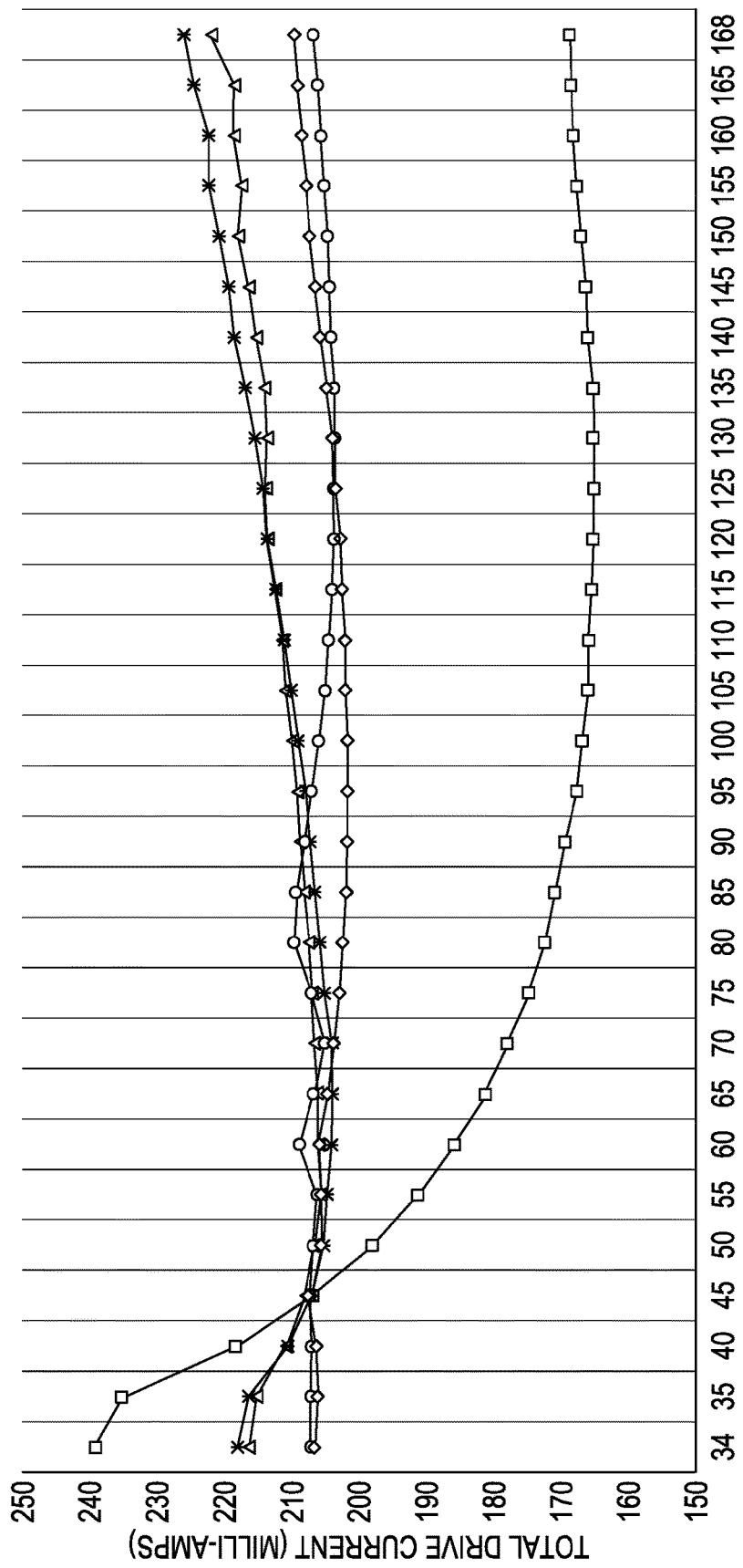
FIG. 7 is a chart depicting the effect of a compensation circuit on current variance with voltage change according to one alternative.
Figure 8:
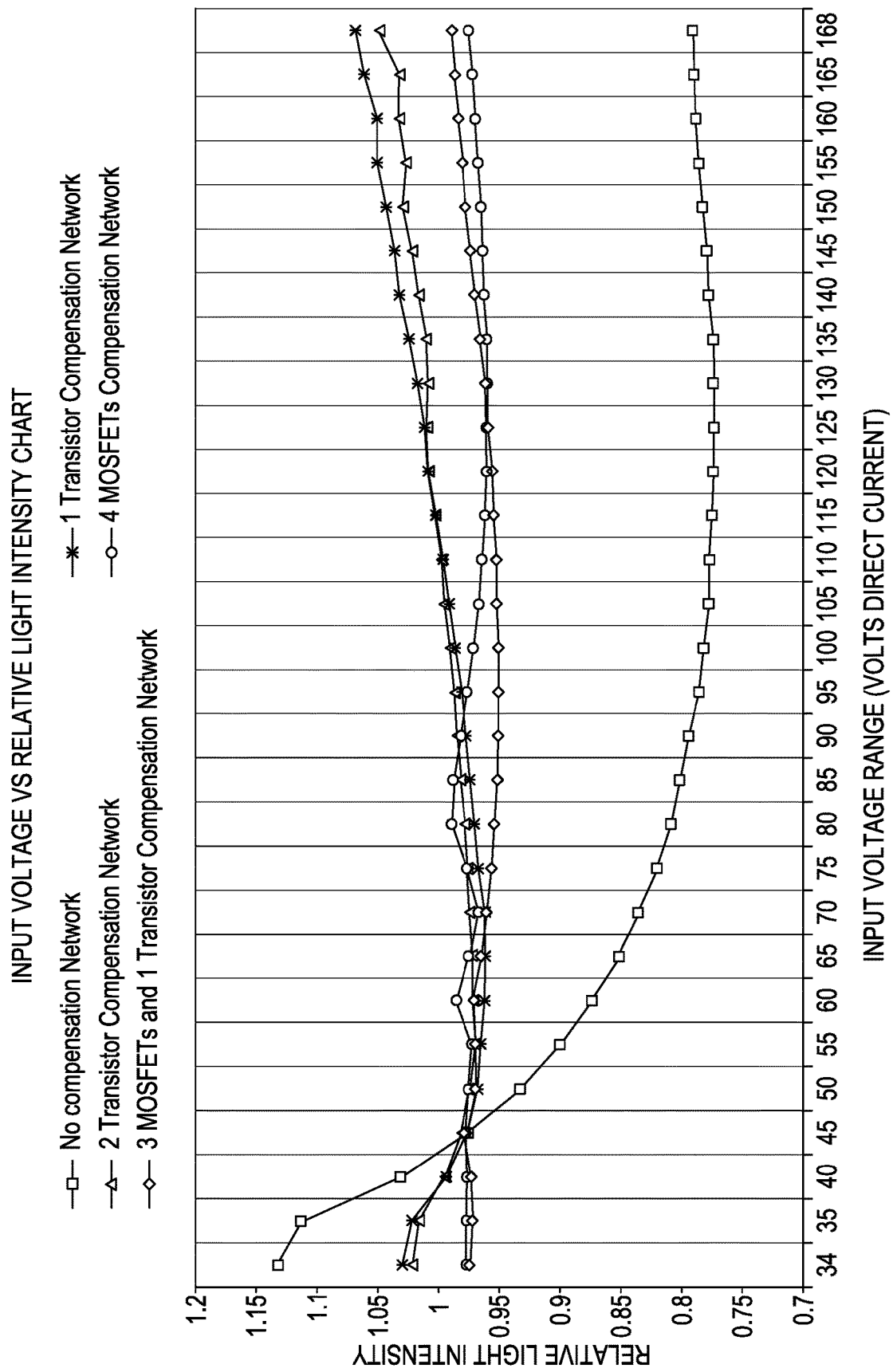
FIG. 8 is a chart depicting the effect of a compensation circuit on LED light intensity variance with voltage change according to one alternative.

From the data collected it can be seen from FIGS. 7 and 8 that when no compensation network is present, the difference between the maximum drive current to minimum drive current over the full voltage range was 30.96% and the difference between the maximum to minimum relative light intensity was 30.61%.

When 1 transistor compensation network was used, the difference between maximum to minimum drive current current over the full voltage range was reduced to 9.73% while the difference between maximum to minimum relative light intensity dropped down to 9.69%.

The LED drive current and relative light intensity difference current over the full voltage range reduced even further to 7.12% and 7.31% respectively when a 2 transistor compensation network was used.

The data also shows that when a 3 MOSFET and 1 transistor compensation network is used the difference between maximum to minimum drive current over the full voltage range was 3.8% and difference between maximum to minimum relative light intensity reduced to 3.6%.

Most improvement was seen when 4 MOSFET compensation network was used, the LED drive current difference dropped down to 2.9% and relative light intensity difference dropped down to 2.75% over the full voltage range. It is clear that as more compensation networks are implemented, the better the regulation of the drive current and light intensity variance is achieved.

As many changes can be made to the preferred embodiment of the disclosure without departing from the scope thereof; it is intended that all matter contained herein be considered illustrative and not in a limiting sense.

The invention claimed is:

1. A continuous power distribution circuit board comprising:
    i) a printed circuit board having a top, a bottom, a first end and a second end and a power supply;

ii) a universal single entry point power node proximate one of said first end or said second end for receiving and transmitting alternating current or direct current to said board;

iii) at least one channel on said printed circuit board for passage of current, signal and combinations thereof throughout said board and from said first end to said second end;

iv) at least one bridge rectifier in communication with said universal single entry point power node via said at least one channel for rectifying non-discrete input current to discrete output current;

v) at least one capacitor in communication with said at least one bridge rectifier via said at least one channel, minimizing voltage potential fluctuation from said bridge rectifier;

vi) at least one current load in communication with said at least one capacitor via said at least one channel; and at least two current paths, one of said two paths being positive and the other of said paths being negative, wherein said board maintains a constant current to said at least one current load regardless of input voltage range to said circuit board without any external current controller.

2. The circuit board of claim 1, wherein said printed circuit board further comprises at least one filter between said at least one capacitor and said at least one current load and said at least one filter in communication with said at least one capacitor and said at least one current load via said at least one channel, said at least one filter reducing at least one of the following:

i) conducted noise;
ii) radiated noise;
iii) inrush current;
iv) voltage transients; and
v) further voltage potential fluctuation; and combinations thereof.

3. The circuit board of claim 1, wherein said printed circuit board further comprises at least one input voltage compensation circuit in communication with said at least one current load via said at least one channel, said input voltage compensation circuit providing a constant current to said current load regardless of input voltage to said circuit board.

4. The circuit board of claim 3, wherein said at least one input voltage compensation circuit comprises at least one resistive element in communication with at least one of a base or an emitter of at least one NPN transistor, and optionally at least another resistive element in communication between a collector of said at least one NPN transistor and said at least one current load.

5. The circuit board of claim 3, wherein said at least one input voltage compensation circuit comprises at least one resistive element in communication with at least one of a gate or a drain of at least one N-channel MOSFET, and at least another resistive element in communication between a source of said at least one N-channel MOSFET and said at least one current load.

6. The circuit board of claim 3, wherein said at least one input voltage compensation circuit is in communication with said at least one current load via at least one pin of said at least one current load.

7. The circuit board of claim 6 wherein said at least one pin is selected from the group consisting of a current sense pin, frequency setting pin, linear dimming pin, pulse width modulation pin, and combinations thereof of said at least one current load.

8. The circuit board of claim 7 wherein said at least one current load is at least one current regulating driver, one light emitting diode driver and at least one light emitting diode for use in transit light emitting diode lighting.

9. The circuit board of claim 8 wherein said continuous power distribution circuit board maintains consistent light intensity of said at least one light emitting diode with no more than about 10% variance in light intensity.

10. The circuit board of claim 9, wherein said board distributes at least one of power, a signal, and combinations thereof to a distance of at least 25 metres.

11. The circuit board of claim 8 wherein the light emitting diode is an organic light emitting diode.

12. The circuit board of claim 1, wherein said second end comprises a first end connector for connecting to a first end of another circuit board of claim 1, for transmitting current from said first board to said second board.

13. The circuit board of claim 12, wherein said first end comprises a second end connector for connecting to a second end of another circuit board of claim 1.

14. A transit vehicle comprises the circuit board of claim 1.

15. The transit vehicle of claim 14, wherein said transit vehicle is a train.

16. The circuit board of claim 1 wherein said power supply has a switch mode topology.

17. The circuit board of claim 16 wherein said switch mode topology is selected from the group consisting of buck, boost, buck-boost, sepic, flyback, step-up, step-down, switched capacitor and combinations thereof.

* * * * *